United States Patent
Owa et al.

(10) Patent No.: US 9,291,814 B2
(45) Date of Patent: Mar. 22, 2016

(54) SPATIAL LIGHT MODULATOR, EXPOSURE APPARATUS, AND METHOD FOR MANUFACTURING DEVICE

(75) Inventors: Soichi Owa, Suginami (JP); Yoji Watanabe, Okegawa (JP); Tomoharu Fujiwara, Gyoda (JP)

(73) Assignee: Nikon Corporation, Tokyo (JP)

( * ) Notice: Subject to any disclaimer, the term of this patent is extended or adjusted under 35 U.S.C. 154(b) by 185 days.

(21) Appl. No.: 13/825,634

(22) PCT Filed: Sep. 16, 2011

(86) PCT No.: PCT/JP2011/071198
§ 371 (c)(1),
(2), (4) Date: Mar. 22, 2013

(87) PCT Pub. No.: WO2012/039353
PCT Pub. Date: Mar. 29, 2012

(65) Prior Publication Data
US 2013/0278912 A1    Oct. 24, 2013

Related U.S. Application Data

(60) Provisional application No. 61/489,470, filed on May 24, 2011.

(30) Foreign Application Priority Data

Sep. 22, 2010   (JP) ................................. 2010-212850

(51) Int. Cl.
*G03B 27/72*   (2006.01)
*G03B 27/54*   (2006.01)
(Continued)

(52) U.S. Cl.
CPC  *G02B 26/06* (2013.01); *G02B 5/09* (2013.01); *G02B 27/425* (2013.01); *G03F 7/70291* (2013.01)

(58) Field of Classification Search
CPC .. G03F 7/70058; G03F 7/70291; G02B 26/00
USPC .......................... 355/53, 67–71; 359/291–292
See application file for complete search history.

(56) References Cited

U.S. PATENT DOCUMENTS

2003/0030781 A1* 2/2003 Bleeker et al. ................... 355/67
2005/0128565 A1* 6/2005 Ljungblad ....................... 359/291
(Continued)

FOREIGN PATENT DOCUMENTS

EP         1471372       10/2004
JP        2005-123586     5/2005
(Continued)

OTHER PUBLICATIONS

Chen et al., "Design and fabrication of tilting and piston micromirrors for maskless lithography," *Proc. of SPIE*, 5751:1023-1037 (2005).
(Continued)

*Primary Examiner* — Hung Henry Nguyen
(74) *Attorney, Agent, or Firm* — Klarquist Sparkman, LLP

(57) ABSTRACT

A spatial light modulator has a plurality of mirror elements each of which is controllable into a first state in which the mirror element reflects incident light with a change in a phase thereof by a first phase and a second state in which the mirror element reflects the incident light with a change in the phase thereof by a second phase 180° different from the first phase; and a boundary portion arranged between the mirror elements, which changes the phase of the incident light by a third phase substantially (90°+k·180°) (where k is an integer) different from the first phase. In projecting a pattern with the use of the spatial light modulator, an error caused in the pattern can be reduced even if the light quantity of light passing a gap region between the optical elements in the spatial light modulator is large.

34 Claims, 26 Drawing Sheets

(51) Int. Cl.
  *G02B 26/00* (2006.01)
  *G02B 26/06* (2006.01)
  *G02B 5/09* (2006.01)
  *G02B 27/42* (2006.01)
  *G03F 7/20* (2006.01)

(56) References Cited

U.S. PATENT DOCUMENTS

2005/0157375 A1* 7/2005 Doan et al. ............... 359/291
2007/0242247 A1  10/2007 Shiraishi

FOREIGN PATENT DOCUMENTS

| JP | 2006-148140 | 6/2006 |
| JP | 2007-522485 | 8/2007 |
| JP | 2008-235909 A | 10/2008 |
| JP | 2010-182933 | 8/2010 |
| WO | WO 03/065103 | 8/2003 |

OTHER PUBLICATIONS

International Search Report for International Application No. PCT/JP2011/071198, 2 pages, mailed Nov. 22, 2011.

López, et al., "Two-dimensional MEMS array for maskless lithography and wavefront modulation," *Proc. of SPIE*, 6589:65890S-1-65890S-8 (2007).

Notice of Reasons for Rejection from related Japanese Patent Application No. 2012-535021, dated May 26, 2015, 10 pages (with English translation).

Notice of Reasons for Rejection from related Japanese Patent Application No. P2015-067542, dated Jan. 19, 2016, 8 pages (with English translation).

* cited by examiner

Fig.5
(A)
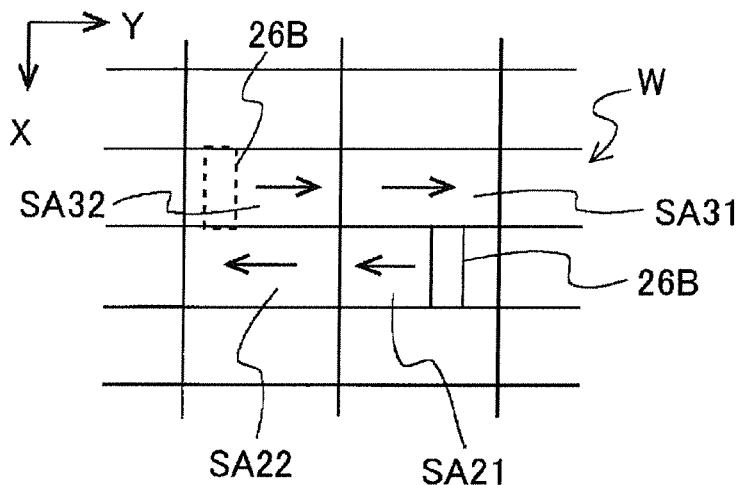
(B)
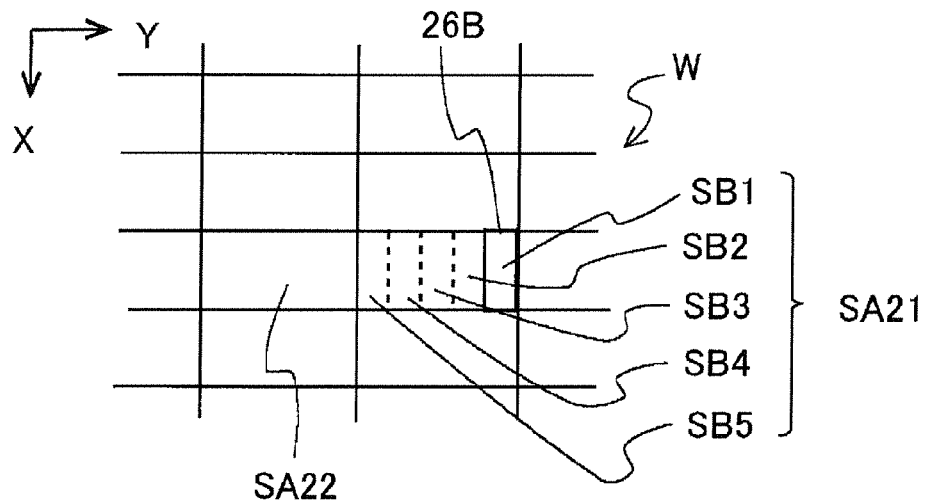

Fig.8
(A)
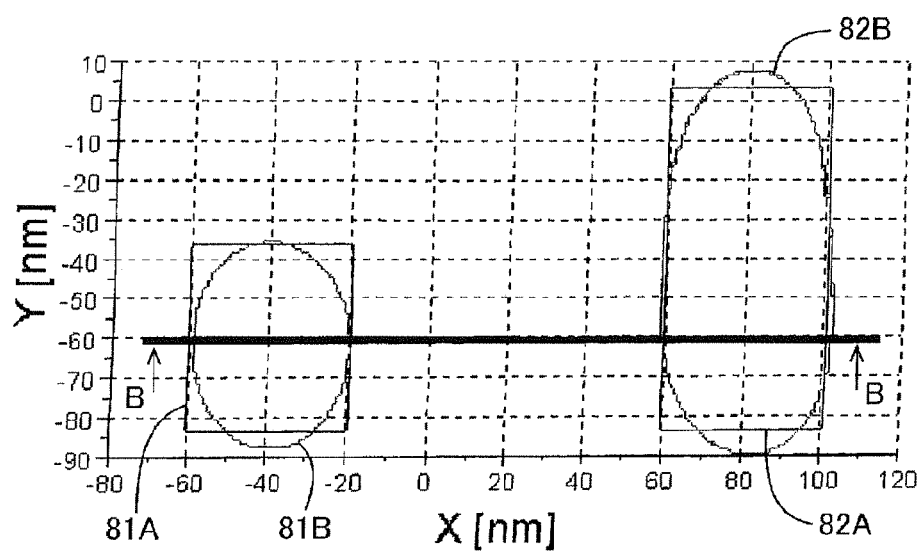
(B)
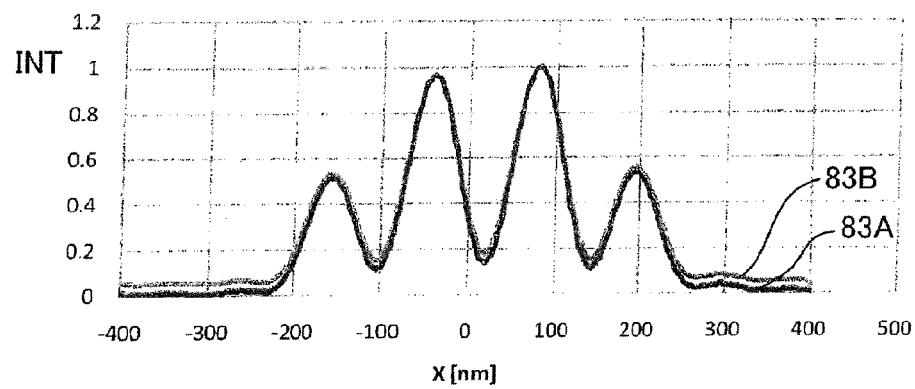

*Fig.9*
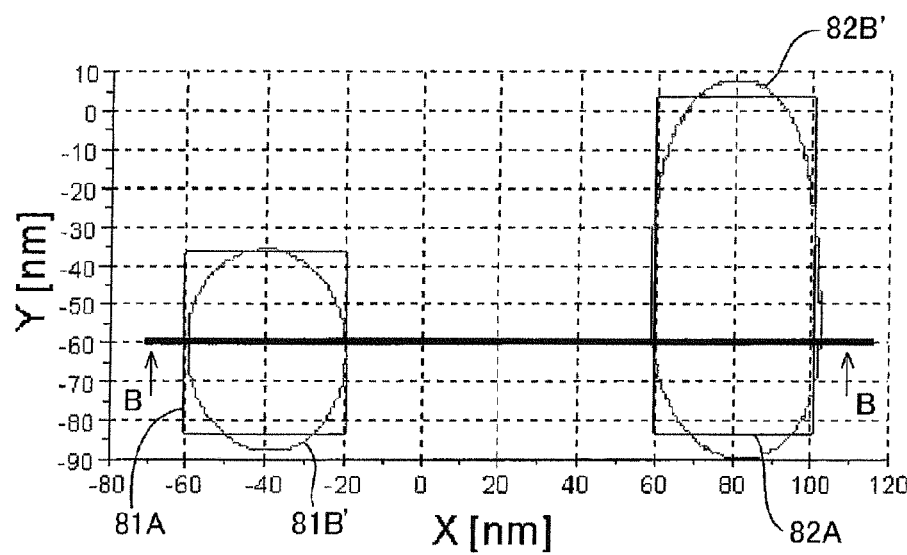
(A)
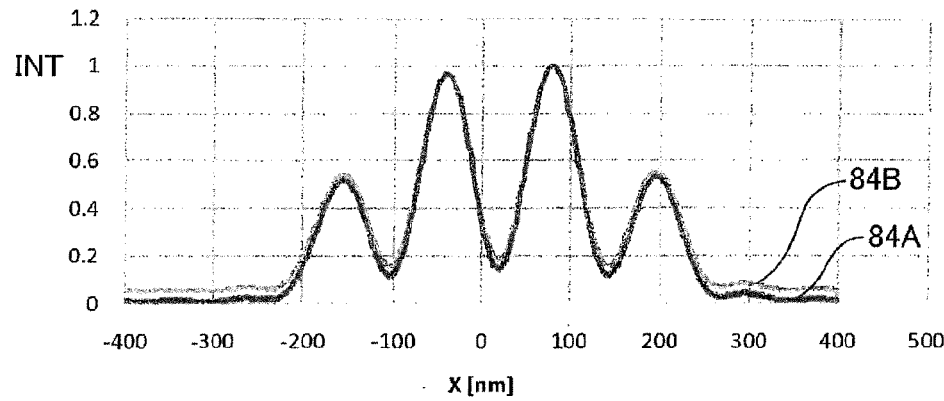
(B)

Fig.18
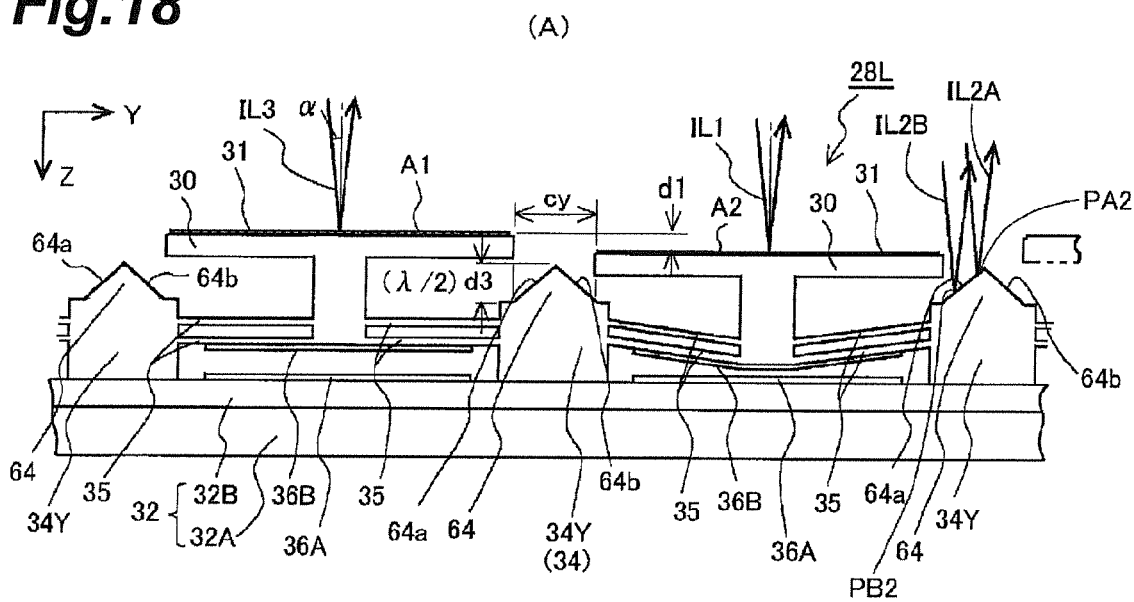
(A)
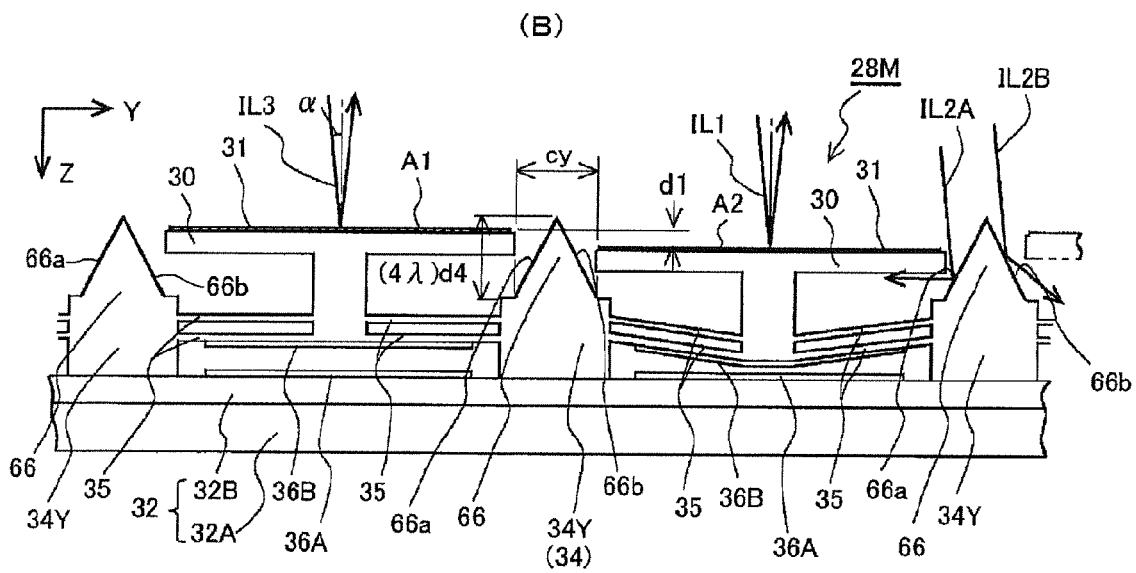
(B)

SPATIAL LIGHT MODULATOR, EXPOSURE APPARATUS, AND METHOD FOR MANUFACTURING DEVICE

CROSS REFERENCE TO RELATED APPLICATIONS

This application is the U.S. National Stage of International Application No. PCT/JP2011/071198, filed Sep. 16, 2011, which in turn claims priority to and the benefit of U.S. Provisional Patent Application No. 61/489,470, filed on May 24, 2011, which in turn claims priority to and the benefit of JP Application No. 2010-212850, filed on Sep. 22, 2010, all of which are incorporated herein by reference in their respective entireties.

TECHNICAL FIELD

The present invention relates to a spatial light modulator having a plurality of optical elements, an exposure technology to expose an object with use of the spatial light modulator, and a device manufacturing technology using the exposure technology.

BACKGROUND ART

The exposure apparatus of a one-shot exposure type such as steppers or the exposure apparatus of a scanning exposure type such as scanning steppers are used for forming a predetermined pattern in each shot area on a substrate such as a wafer or a glass plate through a projection optical system, for example, in a lithography process for manufacturing devices (electronic devices or microdevices) such as semiconductor devices or liquid crystal display devices.

There is the recently-proposed exposure apparatus of a so-called maskless method to generate a variable pattern on the object plane of the projection optical system, using spatial light modulators having an array of many microscopic mirrors an inclination angle of each of which is variable, instead of masks, for efficiently manufacturing each of devices while suppressing an increase of manufacturing cost due to preparation of masks for respective types of devices and masks for respective layers on the substrate (e.g., cf. Patent Document 1). There are also the proposed spatial light modulators of a type having an array of many micromirrors a height of a reflective surface of each of which is controllable, in order to control a phase distribution of incident light (e.g., cf. Non-Patent Document 1 and Non-Patent Document 2).

CITATION LIST

Patent Document

Patent Document 1: Japanese Patent Application Laid-Open No. 2006-148140

Non-Patent Document

Non-Patent Document 1: Yijian Chen et al., "Design and fabrication of tilting and piston micromirrors for maskless lithography," Proc. of SPIE (U.S.A.) Vol. 5751, pp. 1023-1037 (2005)

Non-Patent Document 2: D. Lopez et al., "Two-dimensional MEMS array for maskless lithography and wavefront modulation," Proc. of SPIE (U.S.A.) Vol. 6589, 65890S (2007)

Non-Patent Document 2:

SUMMARY OF INVENTION

Technical Problem

In the conventional spatial light modulators having the array of many micromirrors, it is necessary to keep a gap region of some area between adjacent micromirrors, in order to smoothly drive each of the micromirrors independently of each other. There are also cases where the gap region of a larger area is made between adjacent micromirrors, depending upon the structure and manufacturing steps of the spatial light modulator. In these cases, if the gap region has a low reflectance, the spatial light modulator comes to have a large absorption amount of energy of incident light, which can induce thermal deformation or the like of the spatial light modulator. On the other hand, if the reflectance of the gap region is simply increased, reflected light from the gap region is mixed at random in reflected light from the micromirrors, which can cause a shape error or the like in a pattern projected onto the substrate.

In light of the above-described circumstances, an object of aspects of the present invention is to reduce the error in a pattern even with a large light quantity of light incident to a gap region between optical elements, in a process of projecting (or forming) the pattern onto an object with the use of the spatial light modulator having an array of optical elements.

Solution of Problem

A first aspect of the present invention provides a spatial light modulator having an array of optical elements to be illuminated with light. In this spatial light modulator, each of the optical elements is controllable into a plurality of states including a first state in which the optical element allows incident light to pass without any change in a phase thereof or with a change in the phase by a first phase and a second state in which the optical element allows the incident light to pass with a change in the phase thereof by a second phase 180° different from the first phase, and a boundary portion between the optical elements is provided with a first position and a second position where change amounts of the phase of the incident light are different from each other.

A second aspect provides a spatial light modulator having an array of optical elements to be illuminated with light. In this spatial light modulator, each of the optical elements is controllable into a plurality of states including a first state in which the optical element allows incident light to pass with a change in a phase thereof by a first phase and a second state in which the optical element allows the incident light to pass with a change in the phase thereof by a second phase 180° different from the first phase, and the spatial light modulator comprises at least one boundary portion arranged between the optical elements, the boundary portion changing the phase of the incident light by a third phase different substantially by (90°+k·180° (where k is an integer) from the first phase.

A third aspect provides an exposure apparatus for exposing a substrate with exposure light. This exposure apparatus comprises the spatial light modulator of the first or second aspect, an illumination optical system for illuminating the array of optical elements in the spatial light modulator with the exposure light, a projection optical system for guiding light from the optical elements onto the substrate to project a pattern onto the substrate, and a control device for controlling the optical elements in the spatial light modulator individually into any one of the plurality of states, to control the pattern to be exposed on the substrate.

A fourth aspect of the present invention provides a device manufacturing method comprising: forming a pattern of a photosensitive layer on the substrate, using the exposure apparatus of the present invention; and processing the substrate with the pattern formed thereon.

Effects of the Invention

According to the first aspect of the present invention, the optical elements in the spatial light modulator are controlled each into the plurality of states including the first and second states and the light from the optical elements is guided to the object, whereby the pattern is projected onto the object. Furthermore, since the phases of light from the first and second positions of the boundary portion (gap region) between the optical elements are different from each other and the intensities of the light from the two positions become reduced, the error in the pattern can be reduced even if the light quantity of the light incident to the gap region between the optical elements is large.

According to the second aspect, when the two optical elements on both sides of the boundary portion (gap region) in the spatial light modulator are set in the first state and in the second state and when the phases of light passing the two optical elements are 180° different from each other, the phase of the light passing the boundary portion becomes a nearly middle phase between those of the light passing the two optical elements. Therefore, since widths of portions where the phases of the light passing the two optical elements and the boundary portion are 180° different from each other, are approximately equal to each other, the error in the shape of the pattern projected (or formed) on the object with the use of the spatial light modulator is reduced even if the light quantity of the light incident to the boundary portion is large.

BRIEF DESCRIPTION OF DRAWINGS

FIG. 5(A) is a drawing showing shot areas on a wafer in scanning exposure, and FIG. 5(B) a drawing showing shot areas on a wafer in exposure by the step-and-repeat method;

FIG. 8(A) is an enlarged plan view showing changes of spatial images with change in reflectance of boundary portions, and FIG. 8(B) a drawing showing intensity distributions along the line BB in FIG. 8(A);

FIG. 9(A) is an enlarged plan view showing changes of spatial images with change in reflectance of boundary portions where phases of reflected light are different, and FIG. 9(B) a drawing showing intensity distributions along the line BB in FIG. 9(A);

FIG. 18(A) is an enlarged sectional view showing a part of the spatial light modulator in a seventh modification example, and FIG. 18(B) an enlarged plan view showing a part of the spatial light modulator in an eighth modification example;

DESCRIPTION OF EMBODIMENTS

First Embodiment

The first embodiment of the present invention will be described below with reference to FIGS. 1 to 9.

Figure 1:
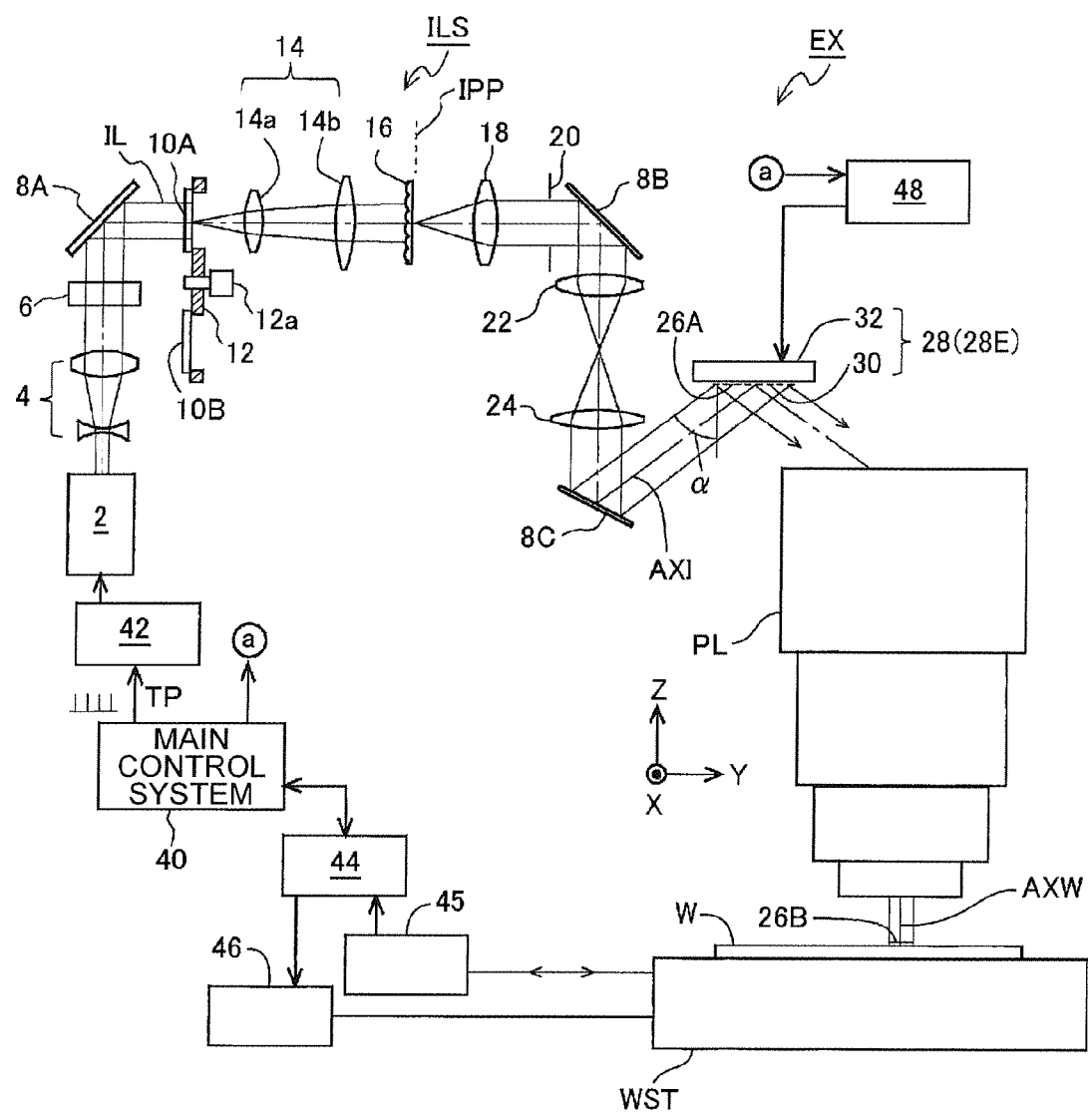
FIG. 1 is a drawing showing a schematic configuration of an exposure apparatus according to a first embodiment.
Figure 2:
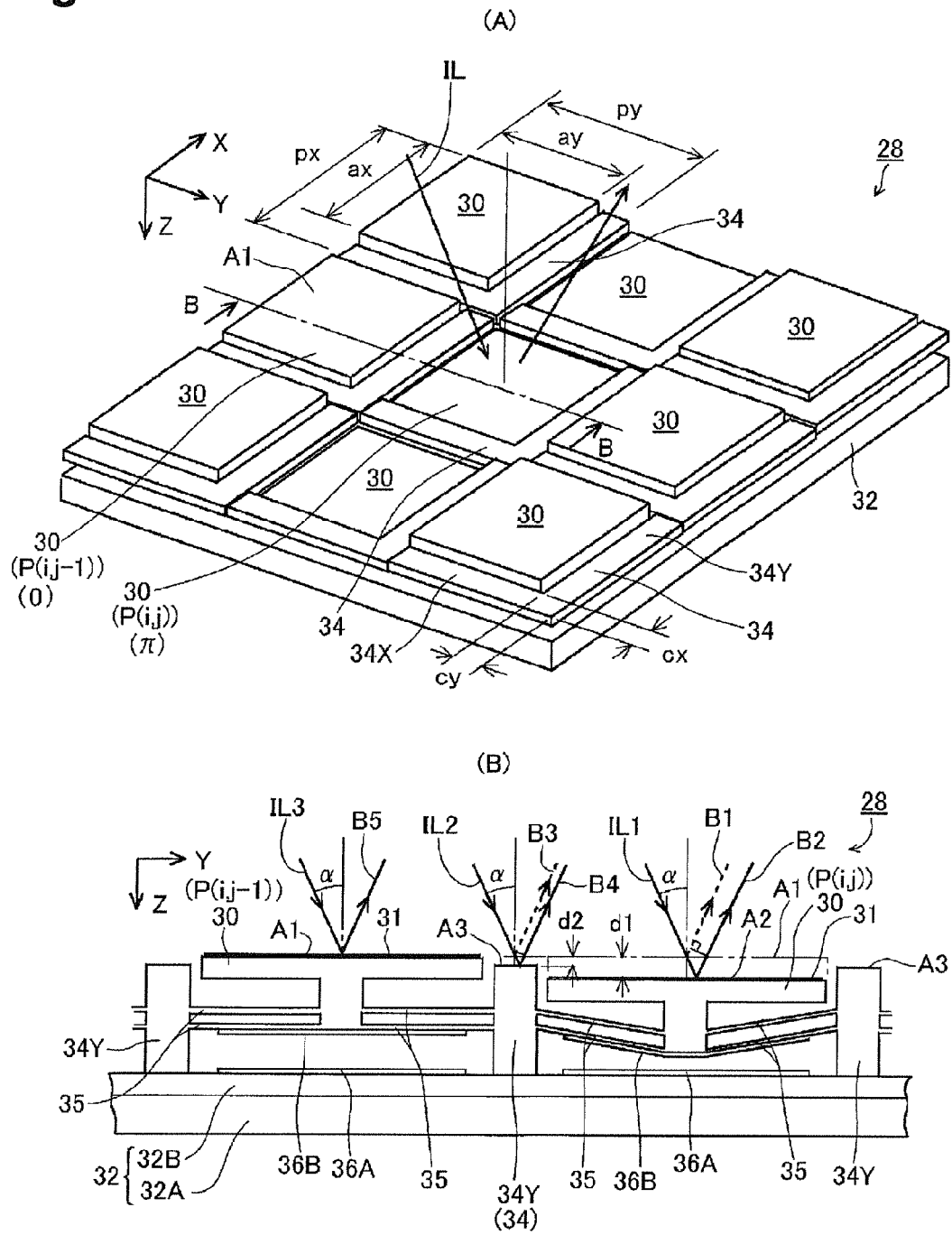
FIG. 2(A) is an enlarged perspective view showing a part of spatial light modulator 28 in FIG. 1, and FIG. 2(B) a cross-sectional view along the line BB in FIG. 2(A)
Figure 3:
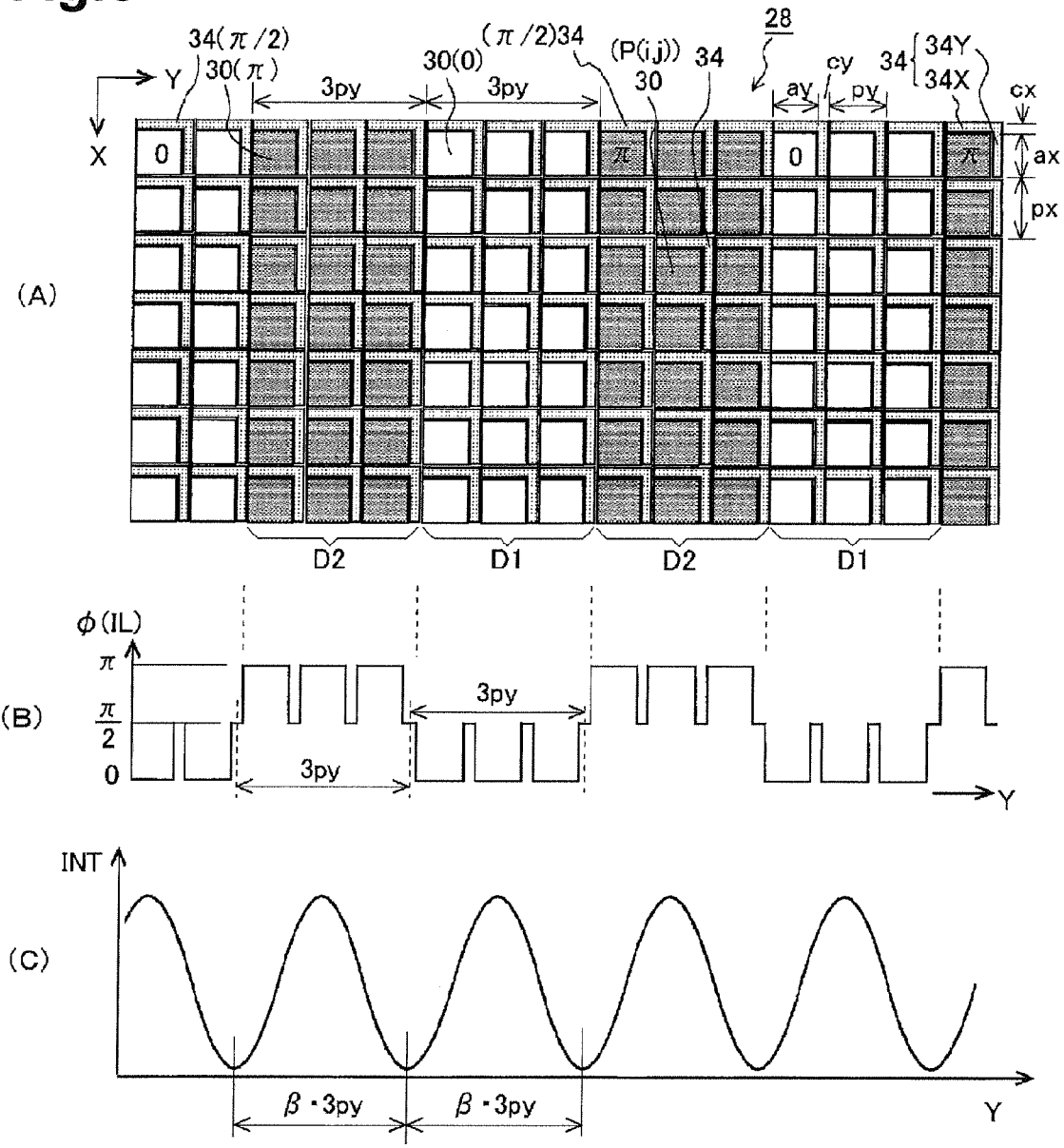
FIG. 3(A) is a partially enlarged plan view showing an example of a phase distribution of reflected light set by the spatial light modulator 28, FIG. 3(B) a drawing showing a phase distribution of reflected light on a straight line along the Y-axis in FIG. 3(A), and FIG. 3(C) a drawing showing an intensity distribution of an image formed by light in the phase distribution of FIG. 3(B)
Figure 4:
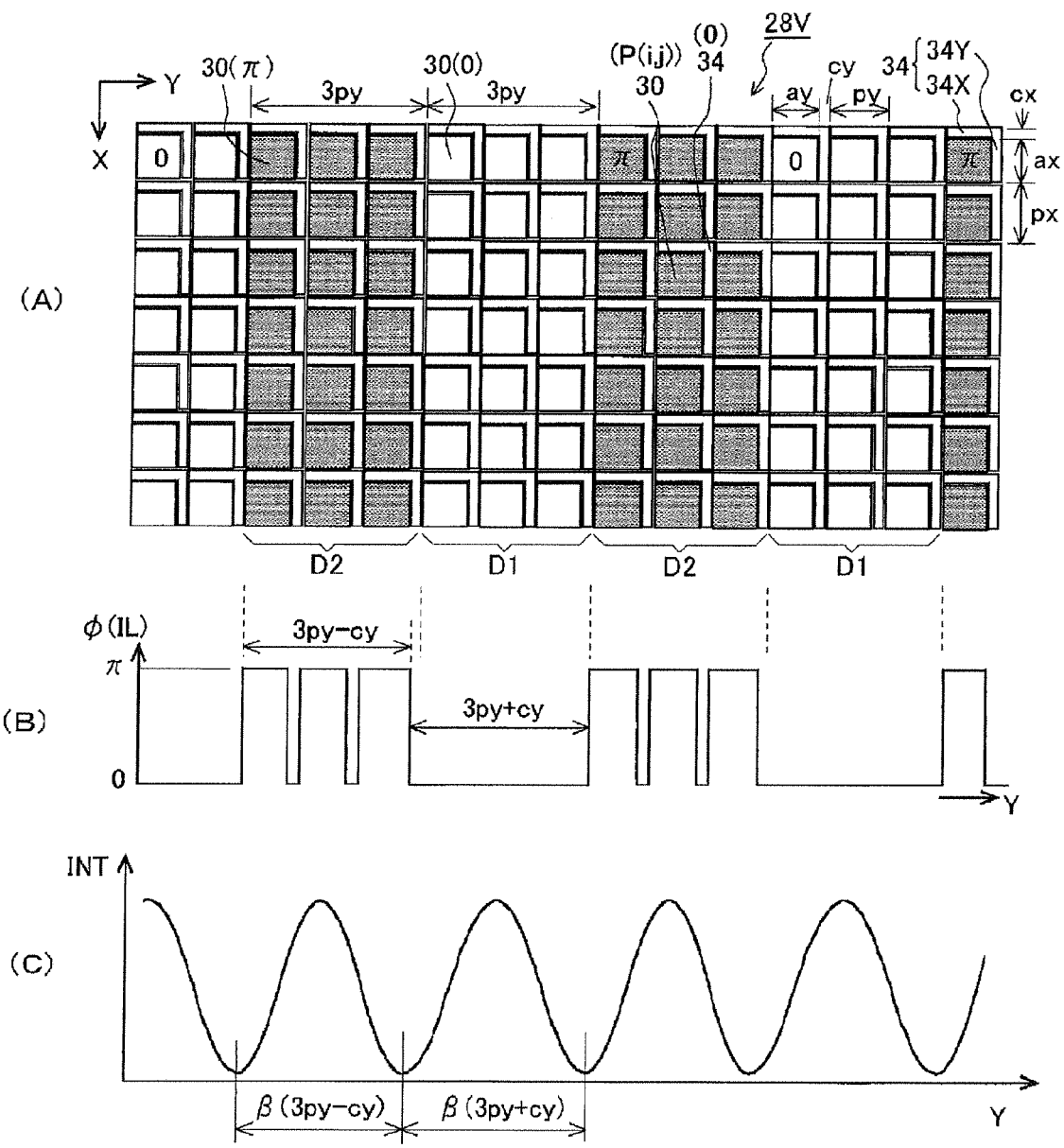
FIG. 4(A) is a plan view showing a phase distribution of reflected light set by spatial light modulator 28V as a comparative example, FIG. 4(B) a drawing showing a phase distribution of reflected light on a straight line along the Y-axis in FIG. 4(A), and FIG. 4(C) a drawing showing an intensity distribution of an image formed by light in the phase distribution of FIG. 4(B)
Figure 6:
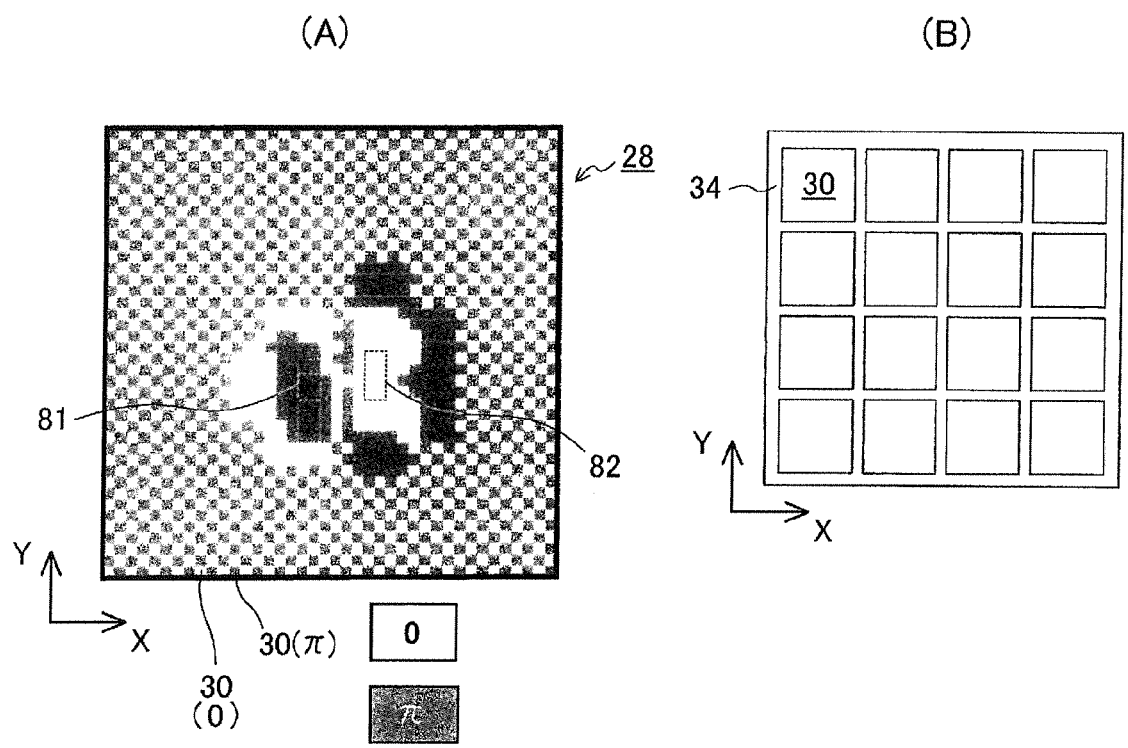
FIG. 6(A) is a partially enlarged plan view showing a phase distribution of reflected light used in simulation, and FIG. 6(B) an enlarged view showing a part of FIG. 6(A)

FIG. 1 shows a schematic configuration of an exposure apparatus EX of the maskless method according to the present embodiment. In FIG. 1, the exposure apparatus EX has a light source 2 for exposure which emits pulses of light, an illumination optical system ILS which illuminates an illumination target surface with illumination light (exposure light) IL, for exposure from the light source 2, a spatial light modulator 28 with a large number of mirror elements 30 which are respective height-variable micromirrors arranged in a two-dimensional array pattern approximately on the illumination target surface or on a surface near it, and a modulation control unit 48 which drives the spatial light modulator 28. Furthermore, the exposure apparatus EX has a projection optical system PL which receives the illumination light IL reflected by a reflective, variable, uneven pattern (mask pattern with a variable phase distribution) generated by the large number of mirror elements 30 and which projects a spatial image (device pattern) created corresponding to the uneven pattern (phase distribution), onto a surface of a wafer W (substrate), a wafer stage WST which performs positioning and movement of the wafer W, a main control system 40 consisting of a computer which generally controls the operation of the overall apparatus, various control systems, and so on.

The description hereinafter will be based on such a coordinate system that in FIG. 1, the Z-axis is set along a direction perpendicular to a bottom surface of the wafer stage WST (a plane parallel to an unrepresented guide surface), the Y-axis is set along a direction parallel to the plane of FIG. 1 in a plane normal to the Z-axis, and the X-axis is set along a direction normal to the plane of FIG. 1. Angles around the X-axis, Y-axis, and Z-axis will also be called angles in θx direction, θy direction, and θz direction, respectively. In the present embodiment, the wafer W is scanned in the Y-direction (scanning direction) during exposure.

The light source 2 used herein is an ArF excimer laser light source which emits pulses of substantially linearly polarized laser light with the wavelength of 193 nm and the pulse width of about 50 ns, at the frequency of approximately 4-6 kHz. The light source 2 also applicable herein can be, for example, a KrF excimer laser light source with the wavelength of 248 nm, a light emitting diode which emits pulsed light, or a solid-state pulsed laser light source which generates a harmonic of laser light output from a YAG laser or a solid-state laser (semiconductor laser or the like). The solid-state pulsed laser light source can emit pulses of laser light, e.g., with the wavelength of 193 nm (or any one of various wavelengths except for it) and with the pulse width of about 1 ns, at the frequency of approximately 1-2 MHz.

In the present embodiment, a power supply 42 is connected to the light source 2. The main control system 40 supplies to the power supply 42, emission trigger pulses TP indicative of timing and light quantity (pulse energy) of pulsed emission. In synchronism with the emission trigger pulses TP, the power supply 42 makes the light source 2 emit pulses at the indicated timing and light quantity.

The illumination light IL consisting of a substantially parallel beam of pulsed laser light with a rectangular sectional shape emitted from the light source 2 travels via a beam expander 4 consisting of a pair of lenses, a polarization control optical system 6 to control a state of polarization of the illumination light IL, and a mirror 8A, to enter a diffractive optical element (diffractive optical element 10A in FIG. 1) selected from a plurality of diffractive optical elements 10A, 10B, and so on, in parallel with the Y-axis. The polarization control optical system 6 is, for example, an optical system that can replaceably set one of a half wave plate to rotate the direction of polarization of the illumination light IL, a quarter wave plate to convert the illumination light IL into circularly polarized light, and a birefringent prism of a wedge shape to convert the illumination light IL into randomly polarized light (unpolarized light).

The diffractive optical elements 10A, 10B, etc. are fixed at approximately equal angle intervals to a peripheral part of a rotary plate 12. The main control system 40 controls the angle of the rotary plate 12 through a drive unit 12a, to set a diffractive optical element selected according to an illumination condition, on the optical path of the illumination light IL. The illumination light IL diffracted by the selected diffractive optical element is guided to an entrance plane of a microlens array 16 by a relay optical system 14 consisting of lenses 14a, 14b. The illumination light IL incident into the microlens array 16 is two-dimensionally divided by a large number of microscopic lens elements forming the microlens array 16, to form a secondary light source (surface light source) on a pupil plane (illumination pupil plane IPP) of the illumination optical system ILS which is a rear focal plane of each lens element.

As an example, the diffractive optical element 10A is provided for normal illumination, the diffractive optical element 10B for small σ illumination to generate illumination light with a small coherence factor (σ value), and other diffractive optical elements (not shown) are also provided for dipolar illumination, for quadrupolar illumination, for annular illumination, and so on. A spatial light modulator having an array of a large number of microscopic mirrors an inclination angle of each of which is variable, may be used instead of the plurality of diffractive optical elements 10A, 10B, etc., and a fly's eye lens or the like can also be used instead of the microlens array 16.

The illumination light IL from the secondary light source formed on the illumination pupil plane IPP travels via a first relay lens 18, a field stop 20, a mirror 8B to bend the optical path into the −Z-direction, a second relay lens 22, a condenser optical system 24, and a mirror 8C, to be incident at an average incidence angle α in the θx direction onto the illumination target surface (a surface where a designed transfer pattern is arranged) parallel to the XY plane. In other words, the optical axis AXI of the illumination optical system ILS intersects at the incidence angle α in the θx direction with the illumination target surface. The incidence angle α is, for example, from several deg (°) to several ten deg. In a power-off condition, reflective surfaces of the large number of mirror elements 30 arranged in the two-dimensional array pattern in the spatial light modulator 28 are arranged on or near the illumination target surface. The illumination optical system ILS is constructed including the optical members from the beam expander 4 to the condenser optical system 24 and the mirror 8C. The illumination light IL from the illumination optical system ILS illuminates a rectangular illumination area 26A elongated in the X-direction on the array of the large number of mirror elements 30 in the spatial light modulator 28, with a substantially uniform illuminance distribution. The large number of mirror elements 30 are arranged at predetermined pitches in the X-direction and in the Y-direction in a rectangular region including the illumination area 26A. The illumination optical system ILS and the spatial light modulator 28 are supported by a frame not shown.

FIG. 2(A) is an enlarged perspective view showing a part of a reflective surface of the spatial light modulator 28 in FIG. 1, and FIG. 2(B) a cross-sectional view along the line BB in FIG. 2(A). In FIG. 2(A), the large number of mirror elements 30 with X-directional width ax and Y-directional width ay are arranged at the pitches (periods) px and py in the X-direction and in the Y-direction, respectively, on the reflective surface of the spatial light modulator 28. As an example, the mirror elements 30 are square, the pitches px, py are equal to each other, and the relations below hold. It is noted herein that the mirror elements 30 may have a rectangular shape or other shape and the pitches px, py may be different from each other.

$$px = py \quad (1A),$$

$$ax = ay < px \quad (1B)$$

On the reflective surface, each of the mirror elements 30 is located at a position P(i, j) which is the ith position (i=1, 2, ..., I) in the X-direction and the jth position (j=1, 2, ..., J) in the Y-direction. As an example, the number J of mirror elements 30 arranged in the Y-direction (direction corresponding to the scanning direction of the wafer W) is several hundreds to several thousands, and the number I of mirror elements 30 arranged in the X-direction is several to several ten times the number J. Furthermore, the pitch px (=py) of arrangement of the mirror elements 30 is, for example, approximately 10 μm to 1 μm.

The spatial light modulator 28 has the large number of mirror elements 30, a base member 32 which supports each of the mirror elements 30 through hinge portions 35 (cf. FIG. 2(B)) each with flexibility (elasticity), and a large number of boundary portions 34 which are arranged in gap regions between adjacent mirror elements 30 and fixed to the base member 32. In the present embodiment, one boundary portion 34 is provided per mirror element 30. The boundary portion 34 is formed of an integrated body of an X-directional boundary portion 34X arranged in close proximity to a −X-directional side face of the mirror element 30 and having a rectangular surface elongated in the Y-direction with an X-directional width cx, and a Y-directional boundary portion 34Y arranged in close proximity to a +Y-directional side face of the mirror element 30 and having a rectangular surface elongated in the X-direction with a Y-directional width cy. In the present embodiment the widths cx, cy are equal to each other as below and the total widths of the mirror element 30 and the boundary portion 34 are smaller than the pitches px, py. It is noted that the widths cx, cy may be different from each other.

$$cx = cy \quad (2)$$

$$ax + cx < px \quad (3A),$$

$$ay + cy < py \quad (3B)$$

In the present embodiment the clearance between mirror element 30 and boundary portion 34 is small and we can handle this case so that the sum of the width of the mirror element 30 and the width of the boundary portion 34 is substantially equal to the pitch of arrangement of the mirror elements 30 as below.

$$ax + cx \approx px \quad (4A),$$

$$ay + cy \approx py \quad (4B)$$

As an example, the width cx of the boundary portion 34X (or the width cy of the boundary portion 34Y) is about several % to 10% of the pitch px (py) of arrangement of the mirror elements 30. A line of boundary portions 34X and a line of boundary portions 34Y are added at the +X-directional and −Y-directional ends, respectively, of the array of mirror elements 30.

In FIG. 2(B), the base member 32 is composed of a substrate 32A of a flat plate shape which is, for example, comprised of silicon, and an insulating layer 32B of silicon nitride (e.g., $Si_3N_4$) or the like formed on a surface of the substrate 32A. The boundary portions 34 of the L-shaped cross section are formed at the predetermined pitches in the X-direction and in the Y-direction on the surface of the base member 32 and a back-side projection of each mirror element 30 is supported through a pair of two-stage hinge portions 35 with flexibility in the Z-direction by elastic deformation, between adjacent Y-directional boundary portions 34Y in the boundary portions 34. The boundary portions 34, hinge portions 35, and mirror elements 30 are integrally formed, for example, of polysilicon. A reflective film 31 comprised of a thin film of metal (e.g., aluminum or the like) to enhance reflectivity is formed on the reflective surface (surface) of each mirror element 30.

Furthermore, electrodes 36A are formed on the surface of the base member 32 on the bottom side of mirror elements 30 and electrodes 36B are formed on the respective bottom faces of the hinge portions 35 so as to be opposed to the electrodes 36A. Signal lines (not shown) for applying a predetermined voltage between corresponding electrodes 36A, 36B for each mirror element 30 are provided in a matrix on the surface of the base member 32 and on the side faces of the boundary portions 34. In this case, in a state without application of the voltage between the electrodes 36A, 36B in a power-off condition or in a power-on condition (first state), the reflective surface of the mirror element 30 agrees with a reference plane A1 which is a plane parallel to the XY plane, as indicated by the mirror element 30 at the position P(i, j−1). On the other hand, in a state with application of the predetermined voltage between the electrodes 36A, 36B in the power-on condition (second state), the reflective surface of the mirror element 30 agrees with a plane A2 displaced by a distance d1 in the Z-direction from the reference plane A1 in parallel with the XY plane, as indicated by the mirror element 30 at the position P(i, j). The modulation control unit 48 in FIG. 1 controls the voltage between electrodes 36A, 36B for each mirror element 30 at the position P(i, j), in accordance with information of the phase distribution (uneven pattern) of the illumination light IL set from the main control system 40. The reflectances of the respective mirror elements 30 are, for example, about 80% or more and each mirror element 30 is set either in the first state or in the second state.

In FIG. 2(B), the surfaces A3 of the boundary portions 34 are parallel to the XY plane and the Z-directional distance between the surfaces A3 and the reference plane A1 is d2. The spatial light modulator 28 of this microscopic three-dimensional structure can be manufactured by use of the MEMS (Microelectromechanical Systems) technology, for example, as described in Non Patent Documents 1 and 2 cited in the Background Art. Since each mirror element 30 of the spatial light modulator 28 needs only to be set in the first state or in the second state by parallel displacement, it is easy to achieve downsizing of the mirror elements 30 and increase in the number of arrangement of mirror elements 30.

In the state in which the reflective surface of each mirror element 30 agrees with the reference plane A1 (the first state), let us define a change amount of the phase of the illumination light IL reflected by the mirror element 30, as a first phase $\delta 1$; in the present embodiment the phase $\delta 1$ is 0°. In the state in which the reflective surface of each mirror element 30 agrees with the plane A2 displaced by the distance d1 from the reference plane A1 (the second state), let us define a change amount of the phase of the illumination light IL reflected by the mirror element 30, as a second phase $\delta 2$; the phase $\delta 2$ is different by 180° ($\pi$(rad)) from the phase $\delta 1$. In this case, the relations below hold. It is, however, noted that an error of several deg(°) from formula (5B) is permitted for the phase $\delta 2$, with consideration to manufacturing error of the spatial light modulator 28, driving error by the modulation control unit 48, and so on. In the description hereinafter the phases without unit refer to phases in rad.

$$\delta 1 = 0° \quad (5A),$$

$$\delta 2 = 180° = \pi \quad (5B)$$

The reflectance of the surfaces A3 of the boundary portions 34 between the mirror elements 30 is, for example, about several ten %. Furthermore, the Z-directional distance d2 between the surfaces A3 of the boundary portions 34 and the reference plane A1 is set so that the change amount of the phase of the illumination light IL reflected by the boundary portions 34 equals an intermediate third phase $\delta 3$ between the first phase $\delta 1$ and the second phase $\delta 2$. In the present embodiment, since the phases $\delta 1$ and $\delta 2$ are represented by formulas (5A) and (5B), the phase $\delta 3$ is expressed as described below, as a difference from the phase $\delta 1$.

$$\delta 3 = 90° + k \cdot 180° \text{ ($k$ is an integer)} = \pi/2 + k \cdot \pi \quad (6)$$

By taking manufacturing errors of the mirror elements 30 and boundary portions 34, Z-directional driving errors of the mirror elements 30, etc. into consideration, however, the change amount (third phase $\delta 3$) of the phase of the illumination light IL reflected by the boundary portions 34 may be in the range approximately satisfying formula (6); for example, it may be within the range of about ±10° with respect to formula (6).

Next, let us find the distance d1 corresponding to formula (5B) and the distance d2 corresponding to formula (6). In FIG. 2(B), an average incidence angle of illumination beams IL1, IL2, IL3 incident to the reflective surfaces of the mirror elements 30 and the surface A3 of the boundary portion 34Y (34) is $\alpha$ in the present embodiment. Let us assume that the wavelength of the illumination beams IL1 and others is $\lambda$ ($\lambda$=193 nm herein) and the refractive index of the gas in the environment where the spatial light modulator 28 is installed, is 1. In this case, the reflective surface of the mirror element 30 at the position P(i, j−1) agrees with the reference plane A1 and the change amount (first phase $\delta 1$) of the phase of reflected beam B5 relative to the illumination beam IL3 incident to the reflective surface thereof is 0.

Next, the illumination beam IL1 is incident to the reflective surface of the mirror element 30 at the position P(i, j), and a difference between the change amount of the phase of reflected beam B1 indicated by a dashed line with the reflective surface agreeing with the reference plane A1 and the change amount of the phase of reflected beam B2 with the reflective surface agreeing with the plane A2 at the distance d1 is the second phase $\delta 2$. The phase difference between the reflected beams B1, B2 is defined by a phase difference of wavefronts perpendicular to the optical paths of the reflected beams B1, B2. In this case, an optical path length op2 of the reflected beam B2 upon arrival of the reflected beam B2 reflected by the plane A2, at the reference plane A1 with the illumination beam IL1 incident thereto is given as follows.

$$op2 = 2d1/\cos\alpha \quad (7A)$$

When the reflected beam B2 arrives at the reference plane A1, an optical path length op1 of the reflected beam B1 reflected by the reference plane A1 as a comparative object is given as follows.

$$op1 = 2d1 \cdot \tan\alpha \cdot \sin\alpha = 2d1 \cdot \sin^2\alpha/\cos\alpha \quad (7B)$$

Therefore, a difference $\delta op2$ of optical path length between the reflected beam B2 and the reflected beam B1 is given as follows using formulas (7A) and (7B).

$$\delta op2 = op2 - op1 \quad (8A)$$
$$= 2d1/\cos\alpha - 2d1 \cdot \sin^2\alpha/\cos\alpha$$
$$= 2d1 \cdot \cos^2\alpha/\cos\alpha$$
$$= 2d1 \cdot \cos\alpha$$

Since this difference $\delta op2$ of optical path length is equal to the optical path length ($\lambda/2$) corresponding to the phase of formula (5B), we obtain the following relation.

$$2d1 \cdot \cos\alpha = \lambda/2 \quad (8B)$$

The distance d1 is obtained as follows from this formula.

$$d1 = (1/\cos\alpha)\lambda/4 \quad (8C)$$

Furthermore, a difference $\delta op3$ between the optical path length of reflected beam B4 of the illumination beam IL2 incident at the incidence angle $\alpha$ to the surface A3 of the boundary portion 34Y (34) and the optical path length of reflected beam B3 reflected by the reference plane A1 upon arrival of the reflected beam B4 at the reference plane A1 is given as follows corresponding to formula (8A).

$$\delta op3 = 2d2 \cdot \cos\alpha \quad (9A)$$

Since this difference $\delta op3$ of optical path length is equal to the optical path length ($\lambda/4 + k \cdot \lambda/2$) corresponding to the phase of formula (6), we obtain the following relation.

$$2d2 \cdot \cos\alpha = \lambda/4 + k \cdot \lambda/2 \quad (9B)$$

The distance d2 is obtained as follows from this formula. In this formula, k is an integer.

$$d2 = (1/\cos\alpha)(\lambda/8 + k \cdot \lambda/4) \quad (9C)$$

As in the case of formula (6), the distance d2 needs to approximately satisfy formula (9C); the distance d2 may be, for example, in the range of $\pm(1/\cos\alpha)(\lambda/8)(10°/90°$ relative to formula (9C), i.e., within the range of about $\pm\lambda/70$. As an example, in the case where the integer k is 0, the incidence angle $\alpha$ is 10°, and the wavelength is 193 nm, the distances d1, d2 are obtained as follows from formulas (8C) and (9C).

$$d1 = 49 \text{ (nm)}, d2 = 24.5 \text{ (nm)} \quad (10)$$

In FIG. 2(A), each of the mirror elements 30 in the spatial light modulator 28 is controlled into the first state in which it reflects the incident illumination light IL with a change of 0° in the phase thereof or into the second state in which it reflects the incident illumination light IL with a change of 180° ($\pi$) in the phase thereof. In the description below, the mirror element 30 set in the first state will also be called a mirror element of phase 0 and the mirror element 30 set in the second state a mirror element of phase $\pi$.

As an example, at every emission of a predetermined number of pulses of illumination light IL, the main control system 40 in FIG. 1 supplies to the modulation control unit 48, information of the phase distribution (uneven pattern) of illumination light IL to be set by the spatial light modulator 28. In accordance therewith, the modulation control unit 48 controls each of the mirror elements 30 in the spatial light modulator 28 to the phase 0 or to the phase $\pi$. A spatial image according to the phase distribution is formed on the surface of the wafer W.

In FIG. 1, the illumination light IL, after reflected by the array of many mirror elements 30 in the illumination area 26A of the spatial light modulator 28, is incident at the average incidence angle $\alpha$ into the projection optical system PL. The projection optical system PL with the optical axis AXW supported by an unrepresented column is a reduction projection optical system which is non-telecentric on the spatial light modulator 28 (object plane) side and telecentric on the wafer W (image plane) side. The projection optical system PL forms a demagnified image of the spatial image according to the phase distribution of the illumination light IL set by the spatial light modulator 28, on an exposure region 26B (which is a region optically conjugate with the illumination area 26A) in one shot area on the wafer W. A projection magnification $\beta$ of the projection optical system PL is, for example, approximately $\frac{1}{10}$ to $\frac{1}{100}$ and the resolution thereof (half pitch or line width) is, for example, approximately a width ($\beta \cdot py$) of an image of a pair of mirror element 30 and boundary portion 34 in the spatial light modulator 28. In other words, a structure smaller than the pitch py of one mirror element 30 on the object plane of the projection optical system PL is not resolved. For example, if the size of mirror element 30 and boundary portion 34 is about several $\mu m$ square and the projection magnification $\beta$ of the projection optical system PL is approximately $\frac{1}{100}$, the resolution of the projection optical system PL is approximately several ten nm.

The wafer W (substrate) includes, for example, one obtained by coating a surface of a base material of a circular flat plate shape of silicon or SOI (silicon on insulator), with a photoresist (photosensitive material) in the thickness of about several ten nm to 200 nm.

With the use of the projection optical system PL non-telecentric on the object side as in the present embodiment, the reflective surfaces of the large number of mirror elements 30 in the spatial light modulator 28 and the exposure surface of the wafer W (the surface of the photoresist) can be arranged approximately in parallel to each other. Therefore, it is easy to design and manufacture the exposure apparatus.

When the exposure apparatus EX is a liquid immersion type, it is provided with a local liquid immersion device to supply and collect a liquid (e.g., pure water) which transmits the illumination light IL, between an optical member at the tip of the projection optical system PL and the wafer W, for example, as disclosed in U.S. Pat. Published Application No. 2007/242247. The resolution can be further increased in the case of the liquid immersion type.

In FIG. 1, the wafer W is sucked and held on the top surface of the wafer stage WST through a wafer holder (not shown) and the wafer stage WST is configured to implement step movement in the X-direction and Y-direction on an unillustrated guide surface and movement at a constant speed in the Y-direction. X-directional and Y-directional positions, an angle of rotation in the $\theta z$ direction, etc. of the wafer stage WST are measured by a laser interferometer 45 and this measurement information is supplied to a stage control system 44. The stage control system 44 controls the position and speed of the wafer stage WST through a driving system 46 such as a linear motor, based on the control information from the main control system 40 and the measurement information from the laser interferometer 45. The apparatus is also provided with an alignment system (not shown) to detect positions of alignment marks on the wafer W, for carrying out alignment of the wafer W.

For carrying out exposure of the wafer W, the alignment of the wafer W is first carried out and thereafter an illumination condition of the illumination optical system ILS is set. Then the wafer W is positioned at a scan start position, for example, for carrying out exposure in shot areas SA21, SA22, . . . aligned on a line in the Y-direction on the surface of the wafer W shown in FIG. 5(A). Thereafter, scan is started at a constant speed in the +Y-direction on the wafer W. Arrows in the shot areas SA21 and others in FIG. 5(A) indicate directions of movement of the exposure region 26B relative to the wafer W.

Next, the main control system 40 supplies to the modulation control unit 48, the information of the phase distribution of the illumination light IL on the reflective surface of the spatial light modulator 28 corresponding to the spatial image to be formed in the exposure region 26B, according to the position of the exposure region 26B on the wafer W relative to the shot area SA21, and supplies the emission trigger pulses TP to the power supply 42. This results in sequential exposure of the intended spatial image according to the position in the Y-direction in the exposure region 26B. This operation is repeatedly carried out before the shot area SA21 has crossed the exposure region 26B, whereby the overall spatial image (circuit pattern) is exposed in the shot area SA21.

Thereafter, for exposure of the shot area SA22 adjacent to the shot area SA21 on the wafer W, while the wafer W is kept scanned in the same direction, the main control system 40 supplies the information of the phase distribution of illumination light IL to the modulation control unit 48 and supplies the emission trigger pulses IP to the power supply 42. In this manner, the exposure can be continuously carried out from the shot area SA21 to SA22. Then, supposing the exposure is shifted to exposure on a line including the adjacent shot areas SA31, SA32 in the X-direction on the wafer W in FIG. 5(A), the wafer stage WST is actuated to implement step movement of the wafer W in the X-direction (non-scanning direction perpendicular to the scanning direction). Then, the scanning direction of the wafer W relative to the exposure region 26B indicated by a dotted line is set to the opposite −Y-direction, and the main control system 40 supplies the information of the phase distribution of illumination light IL in the reverse order to the modulation control unit 48 and supplies the emission trigger pulses TP to the power supply 42, whereby the exposure can be continuously carried out from the shot area SA32 to SA31. In this exposure, it is also possible to implement exposure of mutually different spatial images in the shot areas SA21, SA22, and so on. Thereafter, the photoresist of the wafer W is developed to form a resist pattern in each shot area on the wafer W.

Next, let us explain influence of the reflected light of illumination light IL on the boundary portions 34 in the spatial light modulator 28 in FIG. 2(A). As an example, let us assume that, as shown in FIG. 3(C), a spatial image with a light intensity distribution INT the Y-directional pitch of which is three times the pitch of images of the mirror elements 30, ($\beta \cdot 3py$) (where $\beta$ is the projection magnification), i.e., an image of a line-and-space pattern (which will be referred to hereinafter as L&S pattern) with the Y-directional pitch of $\beta \cdot 3py$ is formed on the surface of the wafer W. In this case, the illumination condition of the illumination optical system ILS in the exposure apparatus EX is, for example, small a illumination with the $\sigma$ value of about 0.1 to 0.05, and the direction of polarization of the illumination light IL is set to be the X-direction on the wafer W. Then the phase distribution of the array of mirror elements 30 in the spatial light modulator 28 is set to a distribution as shown in an enlarged plan view of FIG. 3(A), each mirror element 30 in first regions D1 each including four or more mirror elements 30 in the X-direction and three mirror elements 30 in the Y-direction is in the first state (phase 0) and each mirror element 30 in second regions D2 being adjacent to the first regions D1 in the Y-direction and each including four or more mirror elements 30 in the X-direction and three mirror elements 30 in the Y-direction is in the second state (phase $\pi$). It is noted that FIG. 3(A) and below-described FIG. 4(A) are perspective drawings and the mirror elements 30 in the second state are hatched. The Y-directional widths of the regions D1 and D2 each are 3py.

In the present embodiment, the phase of the illumination light IL impinging on and reflected by the boundary portions 34 in the regions D1, D2 is changed by $\pi/2$ (90°) with respect to the reflected light by the mirror elements 30 in the first state (phase 0). The integer k in formula (6) is set to be 0. For this reason, the phase distribution $\phi$(IL) of reflected light of the illumination light IL on a straight line parallel to the Y-axis (a straight line not passing the boundary portions 34X in the X-direction) on the reflective surface of the spatial light modulator 28 in FIG. 3(A) varies as shown in FIG. 3(B). In FIG. 3(B), the phase of portions with the Y-directional width of (3py−cy) in the regions D1 is approximately 0, the phase of portions with the Y-directional width of (3py−cy) in the regions D2 is approximately $\pi$(180°), and the phase of portions with the Y-directional width of cy (e.g., one boundary portion 34Y in FIG. 3(A)) between the regions D1, D2 is $\pi/2$. Since the projection optical system PL does not resolve the structure smaller than the pitches py, px of the mirror elements 30 on the object plane, the portions (two boundary portions 34Y) with the Y-directional width cy and the phase of $\pi/2$ inside the regions D1, D2, and the portions (boundary portions 34X) with the X-directional width cx and the phase of $\pi/2$ become portions where there is no substantial phase change for the projection optical system PL.

For this reason, the phase distribution $\phi$(IL) of FIG. 3(B) becomes a distribution of repetitions of the portion with the substantial Y-directional width (3py−cy) and the phase of 0, the portion with the Y-directional width cy and the phase of $\pi/2$, the portion with the substantial Y-directional width (3py−cy) and the phase of $\pi$, and the portion with the Y-directional width cy and the phase of $\pi/2$. Therefore, the Y-directional light intensity distribution INT of the image by the projection optical system PL corresponding to the phase distribution $\phi$(IL) becomes a sinusoidal wave with the pitch of $\beta \cdot 3py$, as shown in FIG. 3(C), and, for this reason, the L&S pattern with the pitch of $\beta \cdot 3py$ is obtained by development of the photoresist even if the reflectance of the boundary portions 34 in the spatial light modulator 28 is high.

In contrast to it, a spatial light modulator 28V as a comparative example in FIG. 4(A) is configured so that the boundary portions 34 between the mirror elements 30 cause a change of 0 in the phase of the incident illumination light as the mirror elements 30 in the first state (phase 0) do. In this comparative example, as in FIG. 3(A), the states of the large number of mirror elements 30 are set in a distribution in which each mirror element 30 in the first regions D1 is in the first state (phase 0) and each mirror element 30 in the second regions D2 adjacent in the Y-direction to the first regions D1 is in the second state (phase $\pi$).

In this comparative example, the phase distribution $\phi$(IL) of reflected light of the illumination light IL on a straight line parallel to the Y-axis in FIG. 4(A) (a straight line not passing the X-directional boundary portions 34X) varies as shown in FIG. 4(B). Since in this comparative example the phase of the reflected light on the boundary portions 34Y is 0, in FIG. 4(B), the phase of each portion with the Y-directional width of (3py+cy) including a region D1 and one boundary portion 34Y is approximately 0 and the phase of each portion with the Y-directional width of (3py−cy) excluding one boundary portion 34Y from the region D2 is approximately $\pi$. In this case as well, the portions with the Y-directional width cy and the phase of 0 (two boundary portions 34Y) inside each region D2 are portions where there is no substantial phase change for the projection optical system PL.

For this reason, the phase distribution $\phi$(IL) of FIG. 4(B) becomes a distribution of repetitions of the portion with the substantial Y-directional width (3py+cy) and the phase of 0 and the portion with the Y-directional width (3py−cy) and the phase of $\pi$. Therefore, the Y-directional light intensity distribution INT of the image by the projection optical system PL corresponding to the phase distribution $\phi$(IL) becomes a distribution in which a sinusoidal wave with the Y-directional pitch of $\beta$(3py+cy) and a sinusoidal wave with the Y-directional pitch of $\beta$(3py−cy) are alternately continuous in each period, as shown in FIG. 4(C). For this reason, the exposure apparatus in the comparative example fails to obtain the L&S pattern with the uniform Y-directional pitch of $\beta \cdot 3py$ eventually. Similarly, when the spatial light modulator is configured to change the phase of the illumination light IL incident to the boundary portions 34 by it as in the case of the mirror elements 30 in the second state, the exposure apparatus in this case also fails to obtain the L&S pattern with the uniform Y-directional pitch of $\beta \cdot 3py$ eventually.

In contrast to it, the spatial light modulator 28 of the present embodiment is configured so that the boundary portions 34 are set to change the phase of the incident illumination light IL to the nearly middle phase between the mirror elements 30 in the first state (phase 0) and the mirror elements 30 in the second state (phase $\pi$). Therefore, even with high reflectance of the boundary portions 34, the intended spatial image (and a device pattern eventually) can be formed in high precision on the surface of the wafer W through the projection optical system PL.

Next, let us explain an example of the simulation result to form isolated patterns (resist patterns) on the surface of the wafer in the present embodiment.

FIG. 6(A) shows a phase distribution of reflected light set by the mirror elements 30 of the spatial light modulator 28, in this simulation. In the phase distribution of FIG. 6(A), the blank mirror elements 30 have the phase of 0 and the gray mirror elements 30 the phase of Tr. The boundary portions 34 are arranged, as shown in FIG. 6(B), between the mirror elements 30 in FIG. 6(A). In this simulation, the X-directional or Y-directional pitch $\beta \cdot px$ (=$\beta \cdot py$) of the image of the mirror elements 30 is 20 nm, the X-directional or Y-directional width $\beta \cdot ax$ (=$\beta \cdot ay$) of the image of the mirror elements 30 is 17.5 nm, and the X-directional or Y-directional width $\beta \cdot cx$ (=$\beta \cdot cy$) of the image of the boundary portions 34 is 2.5 nm.

In this simulation, patterns to be formed on the surface of the wafer are demagnified images at the projection magnification $\beta$ of an imaginary first pattern 81 with the X-directional width (2px) and the Y-directional width ((2+⅕)py) indicated by a dotted line and a rectangular, imaginary second pattern 82 with the X-directional width (2px) and the Y-directional length ((4+⅕)py) indicated by a dotted line, in FIG. 6(A). The first pattern 81 and the second pattern 82 are separated with the X-directional spacing of 4px and the Y-directional spacing of 0. In other words, an ideal image of the first pattern 81 is a rectangular pattern with the width of 40 nm and the length of 44 nm and an ideal image of the second pattern 82 a rectangular pattern with the width of 40 nm and the length of 84 nm. The illumination condition by the illumination optical system ILS was small σ illumination with the σ value of 0.14 and the polarization state of the illumination light IL unpolarized.

Figure 7:
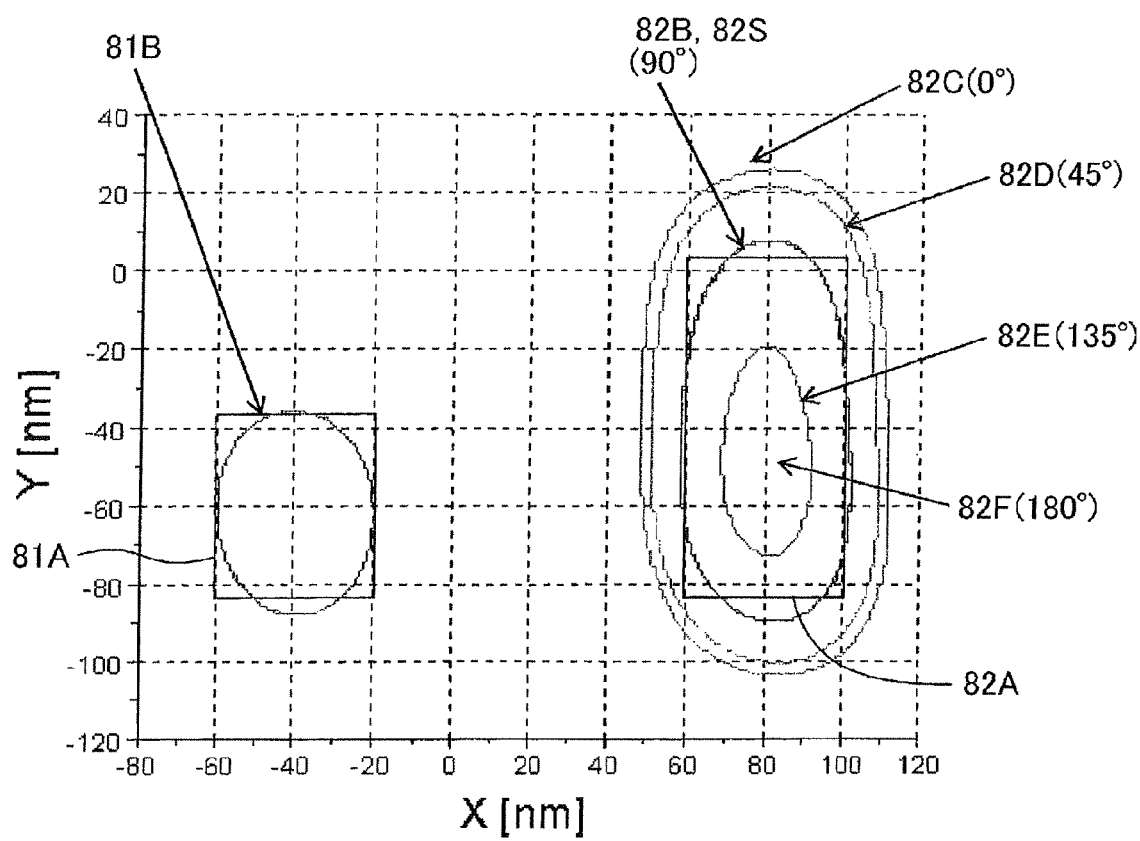
FIG. 7 is an enlarged plan view showing changes of spatial images with change in phase of boundary portions.

Next, FIG. 7 shows the result of calculation of resist patterns (spatial images) for the phase distribution of FIG. 6(A), under the conditions that the phase of the reflected light on the boundary portions 34 in FIG. 6(B) was set at different values of 45° steps and the reflectance of the boundary portions 34 was fixed at 10%. In FIG. 7, the horizontal axis represents the X-axis (nm), the vertical axis the Y-axis (nm), and, square resist pattern 81A and rectangular resist pattern 82A show ideal patterns to be formed (portions where the intensity of the spatial images crosses the photosensitivity level). In the calculation of the spatial images, the photosensitivity level is adjusted so that the X-directional width (CD value) of a substantially circular resist pattern 81B (portion where the intensity crosses the photosensitivity level) being an actual pattern corresponding to the pattern 81A agrees with the X-directional width of the pattern 81A.

In FIG. 7, elliptical resist patterns 82B, 82C, 82D, 82E, and 82F indicate actual patterns corresponding to the pattern 82A in the cases where the phase of the reflected light on the boundary portions 34 is set to 90°, 0°, 45°, 135°, and 180°, respectively. It is seen from this result that the pattern 82B with the phase of 90° is the closest to the ideal image 82A, the patterns 82C, 82D with the phases of 0° and 45° are larger than the pattern 82A, and the patterns 82E, 82F with the phases of 135° and 180° are smaller than the pattern 82A. The pattern 82F in the case of the phase of 180° is not formed. Furthermore, a pattern 82S matching the pattern 82B in FIG. 7 indicates a resist pattern calculated on the assumption that the mirror elements 30 are in close contact (without gap) in FIG. 6(B) and the widths cx, cy of the boundary portions 34 are 0. Therefore, it is found that the resist pattern closest to the ideal pattern 82A is obtained when the phase of the boundary portions 34 is 90° (the value with k=0 in formula (6)).

FIG. 8(A) shows the result of calculation of resist patterns for the phase distribution of FIG. 6(A), under the conditions that the phase of the boundary portions 34 in FIG. 6(B) is fixed at 90° and the reflectance of the boundary portions 34 is varied to various values, and FIG. 8(B) shows intensity distributions INT (normalized by a maximum) on a straight line along the line BB parallel to the X-axis in FIG. 8(A). In FIG. 8(A), a square pattern 81A and a rectangular pattern 82A are respective resist patterns to be formed, and patterns 81B and 82B indicate actual resist patterns corresponding to the patterns 81A and 82A in each of the cases where the reflectance on the boundary portions 34 is set to 0%, 0.1%, 1%, 10%, and 100%. Furthermore, the patterns 81B and 82B also show the resist patterns calculated on the assumption that the mirror elements 30 are in close contact and the width of the boundary portions 34 is 0.

The intensity distribution INT represented by curve 83A in FIG. 8(B) shows the intensity distribution of the spatial images calculated on the assumption that the mirror elements 30 are in close contact and the width of the boundary portions 34 is 0, and the intensity distribution INT represented by curve 83B an intensity distribution of spatial images in the cases where the reflectance is set to 0%, 0.1%, 1%, 10%, and 100%. It is found from these that as long as the phase of the boundary portions 34 is 90°, the resist patterns almost identical with the ideal patterns 81A, 82A are obtained regardless of the reflectance of the boundary portions 34.

Next, FIG. 9(A) shows the result of calculation of resist patterns for the phase distribution of FIG. 6(A), under the conditions that the phase of the boundary portions 34 in FIG. 6(B) is fixed at 270° (the value with k=1 in formula (6)) and the reflectance of the boundary portions 34 is varied to various values, and FIG. 9(B) shows intensity distributions INT (normalized by a maximum) on a straight line along the line BB parallel to the X-axis in FIG. 9(A). In FIG. 9(A), patterns 81B' and 82B' indicate actual resist patterns corresponding to the ideal patterns 81A and 82A in each of the cases where the reflectance on the boundary portions 34 is set to 0%, 0.1%, 1%, 10%, and 100%. Furthermore, the patterns 81B' and 82B' also represent the resist patterns calculated on the assumption that the mirror elements 30 are in close contact and the width of the boundary portions 34 is 0.

The intensity distribution INT represented by curve 84A in FIG. 9(B) represents the intensity distribution of spatial images calculated on the assumption that the mirror elements 30 are in close contact and the width of the boundary portions 34 is 0, and the intensity distribution INT represented by curve 84B an intensity distribution of spatial images in the cases where the reflectance is set to 0%, 0.1%, 1%, 10%, and 100%. It is found from these that as long as the phase of the boundary portions 34 is 270°, the resist patterns almost identical with the ideal patterns 81A, 82A are also obtained regardless of the reflectance of the boundary portions 34.

The effects and others of the present embodiment are as described below.

(1) The exposure apparatus EX of the present embodiment has the spatial light modulator 28. The spatial light modulator 28 has the plurality of mirror elements 30 (optical elements) each of which is controllable into the first state in which the incident light is reflected with a change in the phase thereof by the first phase ($\beta 1$) and into the second state in which the incident light is reflected with a change in the phase thereof by the second phase ($\beta 2$) 180° different from the first phase, and the boundary portions 34 arranged between the plurality of mirror elements 30 and configured to change the phase of the incident light by the third phase ($\beta 3$) different approximately by ($90°+k\cdot 180°$) (k is an integer) from the first phase.

In the present embodiment, where two mirror elements 30 on both sides of the boundary portion 34 (gap region) in the spatial light modulator 28 are set in the first state and in the second state and where the phases of light reflected by the two mirror elements 30 are 180° ($\pi$) different, the phase of light reflected by the boundary portion 34 is the nearly middle phase (90°) between those of the light reflected by the two mirror elements 30. Therefore, the widths of the portions where the phases of the light reflected by the two mirror elements 30 and the boundary portion 34 are 180° different from each other, are equal to each other and, if the light quantity of the light reflected by the boundary portion 34 is large, the error is reduced in the shape of the pattern projected (or formed) on the wafer W with the use of the light from the spatial light modulator 28.

(2) Since the spatial light modulator 28 has the mirror elements 30 (reflective elements) as optical elements, the efficiency of utilization of the illumination light IL is high. It is, however, also possible to use a transmissive spatial light modulator that changes the phase of light transmitted by each of individual optical elements, by predetermined $\phi 1$ or ($\phi 1+180°$) and that changes the phase of light transmitted by boundary portions between the optical elements, by ($\phi 1+90°+k\cdot 180°$), instead of the spatial light modulator 28. Examples of such optical elements include electro-optical elements, liquid crystal cells, and so on to induce variation in refractive index depending upon voltage.

(3) The spatial light modulator 28 is provided with the base member 32 (base part) to which each of the mirror elements 30 is connected through the hinge portions 35 (movable part) and to which the boundary portions 34 are fixed. Therefore, each mirror element 30 can be driven at high speed and with high accuracy.

(4) Since each mirror element 30 of the spatial light modulator 28 is brought into the first state (phase 0) in the power-off condition, the control thereof is easy. Furthermore, since the height of the surfaces of the boundary portions 34 can be set based on the height of the reflective surfaces of the mirror elements 30 at the time of manufacture of the spatial light modulator 28, the change 63 in the phase of the light reflected by the boundary portions 34 can be set with high accuracy.

Each mirror element 30 may be brought into the second state (phase π), into the same height as the boundary portions 34, or into any other height in the power-off condition.

(5) Since the mirror elements 30 of the spatial light modulator 28 are the two-dimensional array, a large-area pattern can be exposed on the wafer W by single-shot exposure. The spatial light modulator 28 may be configured so that the mirror elements 30 are arranged in a one-dimensional array, for example, along the X-direction (the direction corresponding to the non-scanning direction of the wafer W).

(6) The exposure apparatus EX is the exposure apparatus for exposing the wafer W (substrate) with the illumination light IL (exposure light), which has the spatial light modulator 28, the illumination optical system ILS for illuminating the array of mirror elements 30 in the spatial light modulator 28 with the illumination light IL, the projection optical system PL for guiding the reflected light from the mirror elements 30 onto the wafer W to project the pattern onto the wafer W, and the modulation control unit 48 (control device) for controlling the mirror elements 30 in the spatial light modulator 28 individually into the first state or into the second state, in order to control the pattern to be exposed on the wafer W.

The exposure apparatus EX is able to form the intended pattern on the surface of the wafer W with high accuracy because the boundary portions 34 of the spatial light modulator 28 have some reflectance to cause little heat generation, so as to suppress influence of reflection on the boundary portions 34 in the spatial light modulator 28.

Each mirror element 30 of the spatial light modulator 28 may be configured so that it can be set in a plurality of states including a third state and others except for the first state and the second state.

(7) The illumination light IL from the illumination optical system ILS is obliquely incident at the approximate incidence angle α to the plurality of mirror elements 30 (reflective elements) and the reflected light from the mirror elements 30 is incident to the projection optical system PL so as to intersect with the optical axis AXW of the projection optical system PL. Therefore, the projection optical system PL is non-telecentric on the object plane side, and for this reason, the whole of the reflected light from the spatial light modulator 28 can be guided onto the wafer W through the projection optical system PL, resulting in high efficiency of utilization of the illumination light IL. Furthermore, the polarization state of the illumination light IL set by the polarization control optical system 6 can be accurately reproduced on the surface of the wafer W.

(8) The mirror elements 30 are provided in the rectangular region the longitudinal direction of which is the X-direction (first direction), the apparatus is provided with the wafer stage WST (substrate stage) for moving the wafer W in the scanning direction corresponding to the Y-direction (second direction) perpendicular to the X-direction on the image plane of the projection optical system PL, and the modulation control unit 48 moves the pattern (phase distribution) formed by the mirror elements 30, in the Y-direction in accordance with the movement of the wafer W by the wafer stage WST. This allows efficient exposure over the entire surface of the wafer W.

The foregoing embodiment can be modified as described below.

(1) First, the foregoing embodiment showed the scanning exposure of the wafer W with continuous movement of the wafer W. Besides it, as shown in FIG. 5(B), a possible modification is such that each shot area (e.g., SA21) on the wafer W is divided into a plurality of partial regions SB1-SB5 or the like in the Y-direction, a predetermined number of pulses of the illumination light IL are emitted when the partial region SB1 or the like reaches the exposure region 26B of the projection optical system PL, and the partial region SB1 or the like is exposed with the reflected light from the array of mirror elements 30 in the spatial light modulator 28. Thereafter, the wafer W is subjected to step movement in the Y-direction and the partial region SB2 or the like is exposed in the same manner when the next partial region SB2 or the like reaches the exposure region 26B. This method is substantially the step-and-repeat method, but mutually different patterns are exposed in the respective partial regions SB1-SB5 or the like.

(2) Next, the spatial light modulator 28 in FIG. 2(B) shows the configuration wherein the distance d2 between the reflective surface (reference reflective surface A1) of the mirror element 30 in the first state (phase 0) and the surface A3 of the boundary portion 34 (34Y) is determined so as to change the phase of the reflected light from the boundary portion 34 by 90° and wherein the widths cx, cy of the boundary portion 34 are set to be smaller than the gap between the mirror elements 30.

Figure 10:
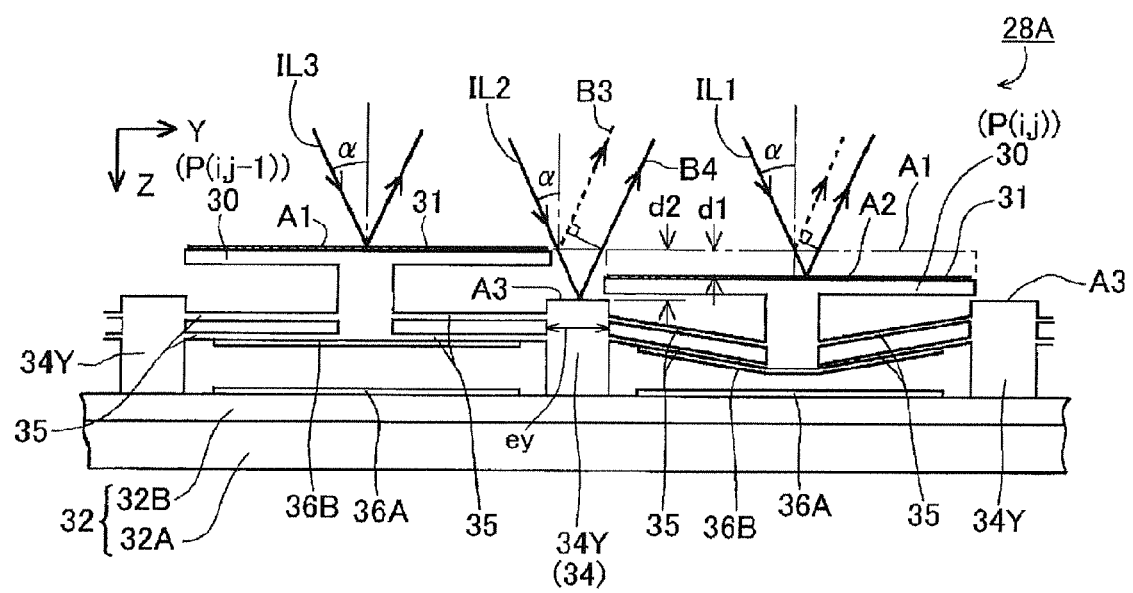
FIG. 10 is an enlarged cross-sectional view showing a part of spatial light modulator 28A in a first modification example.

In contrast to it, as shown by a spatial light modulator 28A of a first modification example in FIG. 10, the distance d2 between the reflective surface (reference reflective surface A1) of the mirror element 30 in the first state (phase 0) and the surface A3 of the boundary portion 34 (34Y) may be determined so as to change the phase of the reflected light from the boundary portion 34 by 270°. In FIG. 10, the portions corresponding to those in FIG. 2(B) are denoted by the same reference signs, without detailed description thereof. This modification example corresponds to the case of k=1 in formula (6). Furthermore, the thickness of the mirror elements 30 is made smaller than half of the distance d1 (the distance between the reflective surface of the mirror element 30 set in the second state (phase π) and the reference reflective surface A1). In this case, the surface A3 of the boundary portion 34 becomes lower than the bottom surfaces of the mirror elements 30 in both of the first state and the second state.

Then, the Y-directional width ey and X-directional width ex (not shown) of the boundary portion 34 are set wider than the gap between the mirror elements 30. Therefore, the relations below hold corresponding to formulas (3A) and (3B), using the widths ax, ay and the pitches px, py of arrangement of the mirror elements 30.

$$ax + ex > px \tag{11A}$$

$$ay + ey > py \tag{11B}$$

Since there is no substantial clearance between the mirror elements 30 and the boundary portion 34 in this modification example, the illumination beam IL2 incident onto the boundary portion 34 is almost entirely reflected. Therefore, it reduces stray light or the like, so as to improve the imaging performance.

(3) In the spatial light modulator 28 of the above embodiment, the boundary portions 34 are fixed to the base member 32. Another possible configuration is, as shown by a spatial light modulator 28B of a second modification example in FIG. 11, such that the boundary portion 38 is integrally provided as a step portion with the distance of d2 from the reflective surface of the mirror element 30, at the +Y-directional end of each mirror element 30. In this case, the boundary portion (not shown) with the distance of d2 from the reflective surface is also integrally provided at the −X-directional end of each mirror element 30. Furthermore, each mirror element 30 is supported so as to be displaceable in the Z-direction through a pair of hinge portions 35 relative to projections 37 fixed on the surface of the base member 32.

Furthermore, for example, in the power-off condition the reflective surface of the mirror element 30 (surface of reflective film 31) is in the first state to match the reference plane A1; in the power-on condition the reflective surface of the mirror element 30 in the second state agrees with the plane A2 at the distance d1 from the reference plane A1, and the surface A4 of the boundary portion 38 is located at the distance of (d1+d2) from the reference reflective surface A1. The distances d1 and d2 satisfy the aforementioned formulas (8C) and (9C), respectively. Therefore, in the spatial light modulator 28B of this second modification example as well, the mirror element 30 in the first state reflects the incident illumination beam IL3 as it is (δ1=0), the mirror element 30 in the second state reflects the incident illumination beam IL1 with a change of 180° in the phase thereof, and the boundary portion 38 reflects the incident illumination beam IL2 with a change of (90°+)k·180° in the phase thereof. This reduces the error in the pattern due to the reflected light from the boundary portion 38.

Figure 11:
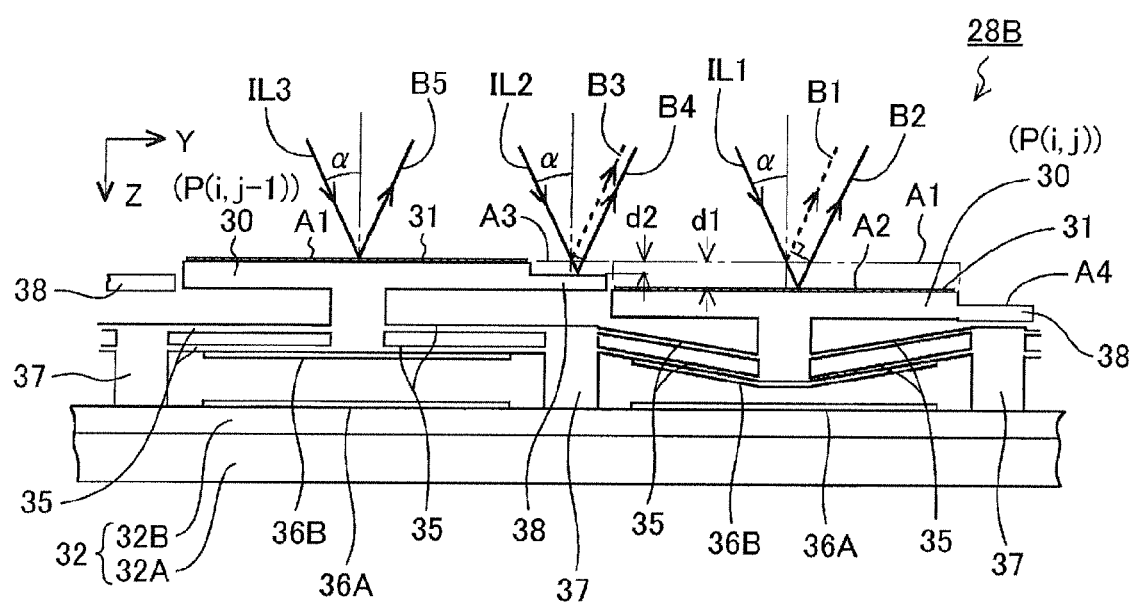
FIG. 11 is an enlarged cross-sectional view showing a part of spatial light modulator 28B in a second modification example.

(4) The spatial light modulator 28B in FIG. 11 shows the configuration wherein the distance d2 between the reflective surface of the mirror element 30 and the surface A3 of the boundary portion 38 is determined so as to change the phase of the reflected light from the boundary portion 34 by 90° and wherein the width of the boundary portion 38 is set smaller than the gap between the mirror elements 30.

Figure 12:
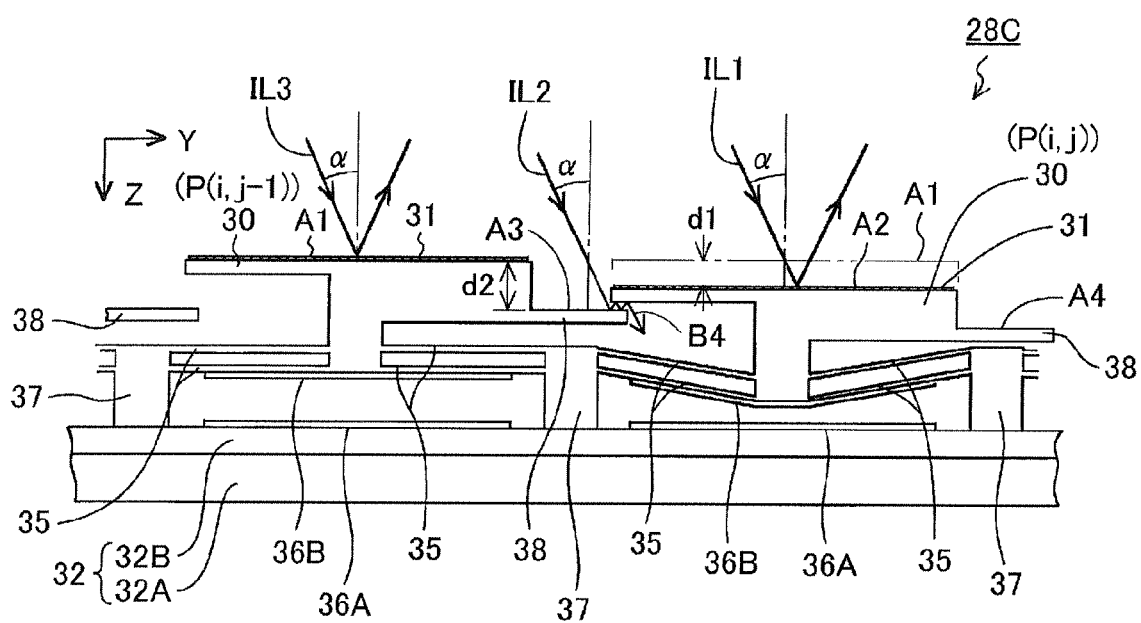
FIG. 12 is an enlarged cross-sectional view showing a part of spatial light modulator 28C in a third modification example.

In contrast to it, as shown by a spatial light modulator 28C of a third modification example in FIG. 12, the distance d2 between the reflective surface of the mirror element 30 and the surface A3 of the boundary portion 38 integrally formed therewith may be determined so as to change the phase of the reflected light from the boundary portion 38 by 270°. In FIG. 12, the portions corresponding to those in FIG. 11 are denoted by the same reference signs, without detailed description thereof. This modification example corresponds to the case where k is set to 1 or 2 in formula (6). Furthermore, the thickness of each mirror element 30 is made smaller than half of the distance d1 and each of the Y-directional width and the X-directional width (not shown) of the boundary portion 38 is set wider than the gap between the mirror elements 30.

Furthermore, in the case where the boundary portion 38 is located on the +Y-directional side with respect to the reflective surface of each mirror element 30, an average incidence direction of the illumination beams IL1 to IL3 onto the respective mirror elements 30 is preferably set in the +Y-direction, as shown in FIG. 12. In this case, the reflected beam B4 of the illumination beam IL2 incident at the incidence angle α to the end of the boundary portion 38 is reflected by the back surface of the adjacent mirror element 30 and is kept from being output from the spatial light modulator 28C; therefore, stray light is reduced, so as to improve the imaging performance.

(5) In the spatial light modulators 28B, 28C of the second modification example in FIG. 11 and the third modification example in FIG. 12, the height of the boundary portion 38 integrated with the mirror element 30 at the position P(i, j−1) is different approximately by the distance d1 from the height of the boundary portion 38 integrated with the mirror element 30 at the position P(i, j) adjacent thereto. Therefore, a change amount of the phase of the illumination light reflected by the boundary portion 38 at the position P(i, j−1) is approximately 180° different from a change amount of the phase of the illumination light reflected by the boundary portion 38 at the position P(i, j). At this time, the illumination light reflected by the boundary portion 38 at the position P(i, j−1) interferes with the illumination light reflected by the boundary portion 38 at the position P(i, j) to reduce their light intensity, so as to further suppress the influence of the reflected light from the boundary portions 38.

Figure 13:
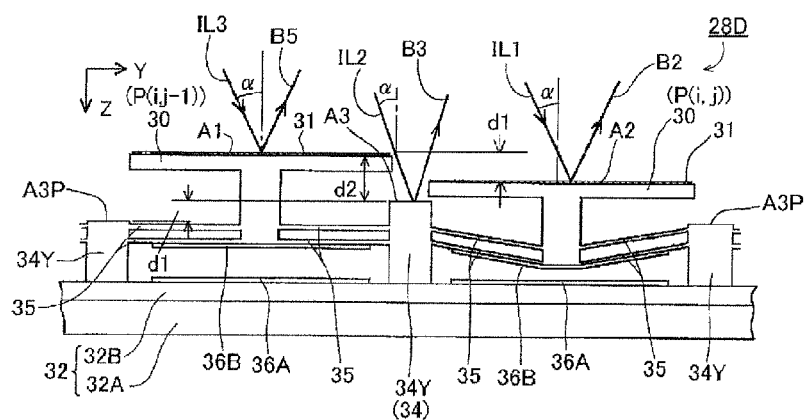
FIG. 13 is an enlarged cross-sectional view showing a part of spatial light modulator 28D in a fourth modification example.

In order to achieve this effect regardless of the heights of the reflective surfaces of the respective mirror elements 30, a possible configuration is, as shown by a spatial light modulator 28D of a fourth modification example in FIG. 13, such that with respect to the height of the surface (reflective surface) A3 of the boundary portion 34Y (34) to which the illumination beam IL2 is incident, the height of surfaces A3P of boundary portions 34Y adjacent thereto is made different approximately by d1 represented by formula (8C) (or by an odd multiple thereof). In FIG. 13 the portions corresponding to those in FIG. 2(B) are denoted by the same reference signs, without detailed description thereof. The difference d2 of height between the reflective surface (reference plane A1) of the mirror element 30 in the first state and the surface A3 corresponds approximately to 270° in terms of the change amount of phase of reflected light. In this case, the phase of the illumination beam IL2 reflected by the boundary portion 34Y (the change amount of phase) is approximately 180° different from the phase of the illumination light reflected by the boundary portion 34Y adjacent thereto (the change amount of phase), whereby the intensity of light resulting from combination of the two reflected beams becomes approximately 0 because of interference between them, so as to minimize the influence of the reflected light from the boundary portions 34.

The change amount of the phase of the illumination beam IL2 reflected by the boundary portion 34Y may be made different by any phase other than 0° or 360° from the change amount of the phase of the illumination light reflected by the boundary portion 34Y adjacent thereto. In this case, the intensity of reflected light from the two boundary portions 34Y also becomes smaller, so as to decrease the influence of the reflected light from the boundary portions 34.

Second Embodiment

Figure 14:
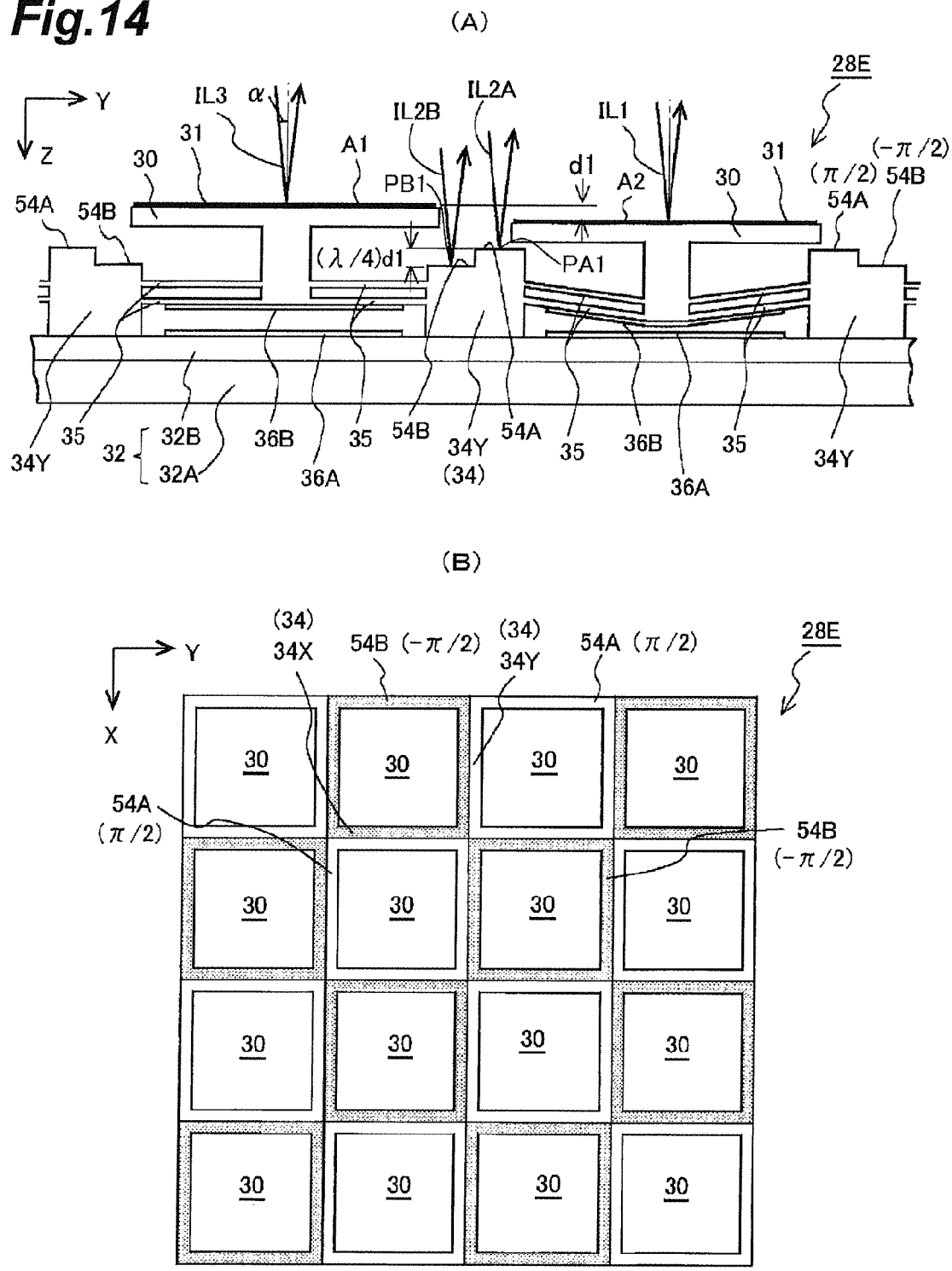
FIG. 14(A) is an enlarged cross-sectional view showing a part of spatial light modulator 28E according to a second embodiment, and FIG. 14(B) an enlarged plan view showing a part of spatial light modulator 28E.
Figure 15:
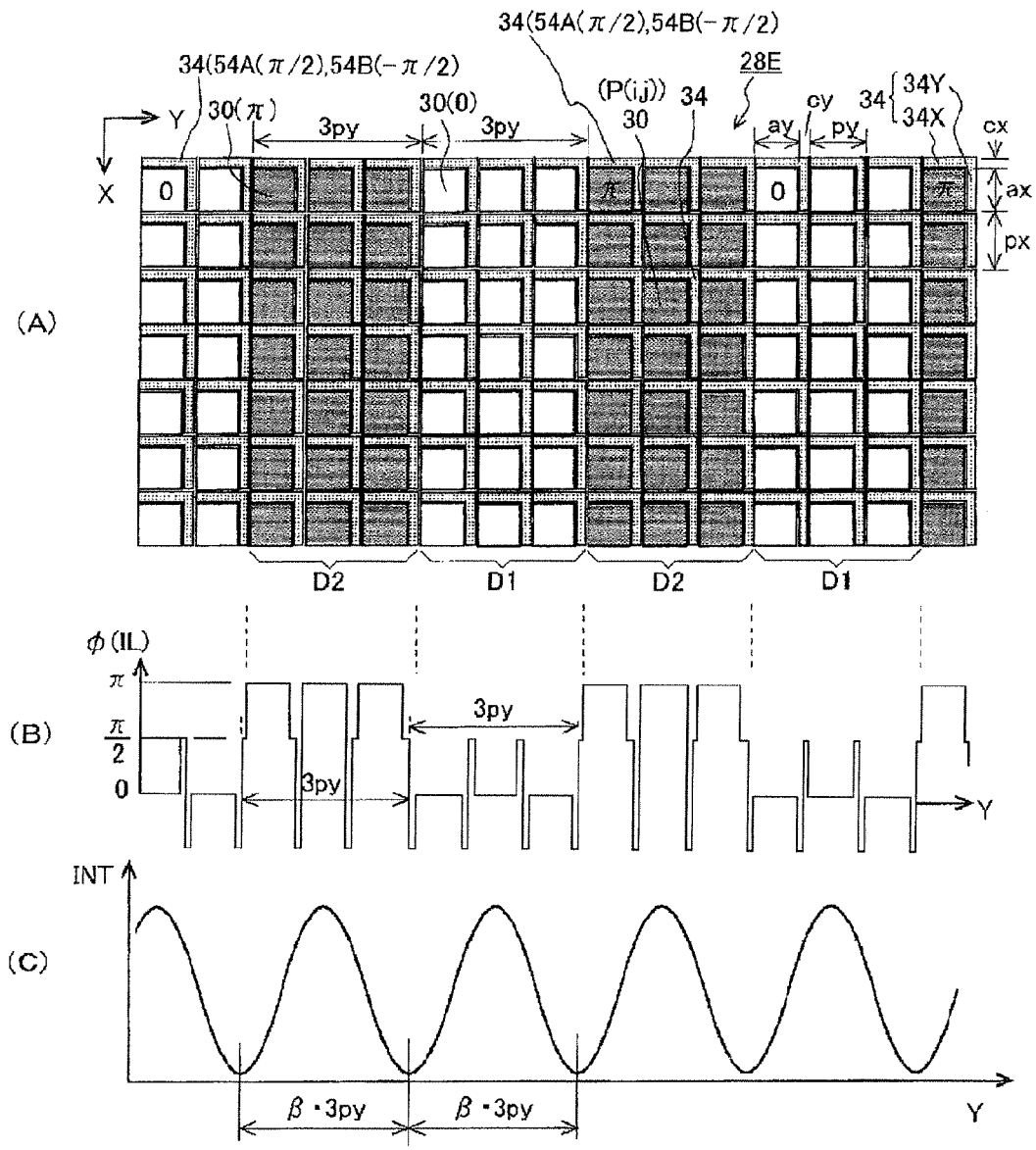
FIG. 15(A) is an enlarged plan view showing an example of a phase distribution of part of reflected light set by the spatial light modulator 28E, FIG. 15(B) a drawing showing a phase distribution of reflected light on a straight line along the Y-axis in FIG. 15(A), and FIG. 15(C) a drawing showing an intensity distribution of an image formed by light in the phase distribution of FIG. 15(B)

Next, the second embodiment of the present invention will be described with reference to FIGS. 14(A) to 15(C). The present embodiment also basically employs the exposure apparatus EX in FIG. 1, but is different therefrom in use of a spatial light modulator 28E shown in FIGS. 14(A) and (B), instead of the spatial light modulator 28 in FIG. 1. In FIGS. 14(A) and (B) and FIGS. 15(A) to (C) the portions corresponding to those in FIGS. 2(B), 2(A), and 3(A) to (C) will be denoted below by the same reference signs, without detailed description thereof.

FIG. 14(A) is an enlarged sectional view showing a part of the spatial light modulator 28E in the present embodiment and FIG. 14(B) an enlarged plan view showing a part of a reflective surface of the spatial light modulator 28E. FIG.

14(B) and below-described FIG. 16(A) and others show perspective drawings of the reflective surface of the spatial light modulator. In FIG. 14(A), the Y-directional width of the plurality of Y-directional boundary portions 34Y supporting the mirror elements 30 (with the reflective film 31 formed on the surface thereof) through the hinge portions 35 on the surface of the base member 32 is set larger than the Y-directional gap between the mirror elements 30. In the surfaces of the boundary portions 34Y, the height (Z-directional position) of a first region 54A of a nearly square frame shape surrounding a certain mirror element 30 is set higher by the distance d1 determined by formula (8C), than the height of a second region 54B of a nearly square frame shape surrounding another mirror element 30 adjacent in the Y-direction to the mirror element 30.

In the present embodiment, as shown in FIG. 14(B), the surfaces of the X-directional boundary portions 34X are also defined so that the height of the first region 54A surrounding a certain mirror element 30 is set higher by the distance d1 than the height of the second region 54B surrounding another mirror element 30 adjacent in the X-direction to the mirror element 30. Therefore, a change amount of the phase of an illumination beam IL2B reflected at a position PB1 in the second region 54B is 180° ($\pi$) different from a change amount of the phase of an illumination beam IL2A reflected at a position PA1 in the first region 54A. By taking the manufacturing error of the boundary portions 34 (34X, 34Y) and others into consideration, the difference between the change amounts of the phases of the illumination beams IL2A, IL2B reflected by the regions 54A, 54B can be within the range of about ±10° with respect to 180°. When the average incidence angle $\alpha$ of the illumination light to the mirror elements 30 is small, the distance d1 becomes approximately $\lambda/4$, using the wavelength $\lambda$ of the illumination light.

In the present embodiment, the heights of the surfaces of the boundary portions 34 (regions 54A, 54B) and the heights of the reflective surfaces (reference plane A1) of the mirror elements 30 in the first state (phase 0) and the reflective surfaces (plane A2) of the mirror elements 30 in the second state (phase it) do not have to satisfy a predetermined relation. In FIG. 14(B) and below-described FIGS. 15(A), 16(A), etc., for convenience' sake of description, a reference is defined as a change amount of the phase of the illumination light reflected by the mirror element 30 in the first state (the first phase $\delta 1=0$), and with respect to the reference, a change amount of the phase of the illumination light reflected by the first region 54A or the like is defined as +90° ($\pi/2$) and a change amount of the phase of the illumination light reflected by the second region 54B or the like as −90° (−$\pi/2$). The other configuration of the spatial light modulator 28E is the same as that of the spatial light modulator 28 in the first embodiment and the height of each mirror element 30 in the spatial light modulator 28E is controlled by the modulation control unit 48 in FIG. 1.

In the present embodiment, let us assume, as an example, a case where an image of an L&S pattern with the Y-directional pitch being three times the pitch of images of the mirror elements 30 ($\beta \cdot 3py$) ($\beta$ is the projection magnification) is formed, as shown in FIG. 15(C), on the surface of the wafer W. In this case, the phase distribution of the array of the mirror elements 30 in the spatial light modulator 28E is set to a distribution in which each mirror element 30 in the first regions D1 each including three mirror elements 30 in the Y-direction is in the first state (phase 0) and each mirror element 30 in the second regions D2 each including three mirror elements 30 in the Y-direction, adjacent in the Y-direction to the first regions D1, is in the second state (phase it).

In the present embodiment, the phases of illumination beams reflected by the regions 54A, 54B with the width of cy/2 in the Y-directional boundary portions 34Y within the regions D1, D2 are changed by $\pi/2$ and −$\pi/2$ with respect to the reflected light from the mirror elements 30 in the first state (phase 0). For this reason, the phase distribution $\phi(IL)$ of reflected light of the illumination light IL on a straight line parallel to the Y-axis (straight line not passing the X-directional boundary portions 34X) on the reflective surface of the spatial light modulator 28E in FIG. 15(A) varies as shown in FIG. 15(B). The projection optical system PL in FIG. 1 does not resolve the structure smaller than the pitches py, px of the mirror elements 30 on the object plane. For this reason, in FIG. 15(B), the regions 54A, 54B with the Y-directional width cy/2 inside the regions D1, D2 are portions where there is no substantial reflected light for the projection optical system PL.

For this reason, the phase distribution $\phi(IL)$ in FIG. 15(B) becomes a distribution of repetitions of the portion with the substantial Y-directional width (3py−cy) and the phase of 0, the portion with the width cy where there is no reflected light, the portion with the substantial Y-directional width (3py−cy) and the phase of $\pi$, and the portion with the width cy where there is no reflected light. Therefore, the Y-directional light intensity distribution TNT of the image by the projection optical system PL corresponding to the phase distribution $\phi(IL)$ becomes a sinusoidal wave with the pitch of $\beta \cdot 3py$, as shown in FIG. 15(C), whereby the L&S pattern can be obtained with the highly accurate pitch of $\beta \cdot 3py$ by development of the photoresist even if the reflectance of the boundary portions 34 (regions 54A, 54B) in the spatial light modulator 28E is high.

The effects and others of the present embodiment are as described below.

The exposure apparatus EX of the present embodiment is provided with the spatial light modulator 28E. The spatial light modulator 28E has the array of mirror elements 30 illuminated with the illumination light IL, and each of the boundary portions 34 (34X, 34Y) next to the mirror elements 30 is provided with the first region 54A (region having the first position PA1) and the second region 54B (region having the second position PB1) by which the change amounts of the phases of light incident thereto are 180° different from each other. Each of the mirror elements 30 can be controlled into the first state in which the incident light is reflected with a change of the first phase (M) and into the second state in which the incident light is reflected with a change of the second phase ($\delta 2$) 180° different from the first phase. The first phase $\delta 1$ is 0 in the present embodiment, but the phase $\delta 2$ may be optionally determined.

In the present embodiment, each of the mirror elements 30 in the spatial light modulator 28E is controlled into the first and second states in accordance with the pattern to be exposed on the wafer, whereby the pattern can be exposed on the wafer W. Furthermore, the phases of light from the regions 54A, 54B of the boundary portion 34 (gap region) between the mirror elements 30 are different from each other and the intensities of light from the two regions 54A, 54B are made smaller on the wafer W; therefore, even if the light quantity of light incident to the gap regions between the mirror elements 30 is large, the error caused in the pattern can be reduced.

The mirror elements 30 may be configured so as to be controllable into a third state or the like to reflect the incident light with a change by a phase different from $\delta 1$ or $\delta 2$ (e.g., 90° or 270° or the like). The change amount of the phase of the illumination beam IL2A reflected by the first region 54A may be made different by any other phase than 0° or 360° from the change amount of the phase of the illumination beam IL2B reflected by the second region 54B adjacent thereto. This also applies to modification examples below. Since the intensities of reflected beams from the two regions 54A, 54B also become smaller in this case, the influence of the reflected light from the boundary portions 34 becomes reduced.

The present embodiment can be modified as described below.

(1) In the present embodiment, the two regions 54A, 54B with the phase difference of 180° between the reflected beams therefrom are provided adjacent to each other in the width direction in the boundary portion 34 between the mirror elements 30. However, as shown by spatial light modulators 28F and 28G of modification examples in FIGS. 16(A) and (B), two regions 55A, 55B and 56A, 56B the change amounts of phases of reflected beams from which are 180° different from each other may be alternately (or periodically) provided adjacent to each other in the longitudinal directions (the X-direction and Y-direction) of the boundary portions 34 between the mirror elements 30. In such cases, the boundaries between the regions 55A, 55B are located at the centers of the mirror elements 30, and the boundaries between the regions 56A, 56B are located at arbitrary positions shifted from the centers of the mirror elements 30.

Figure 16:
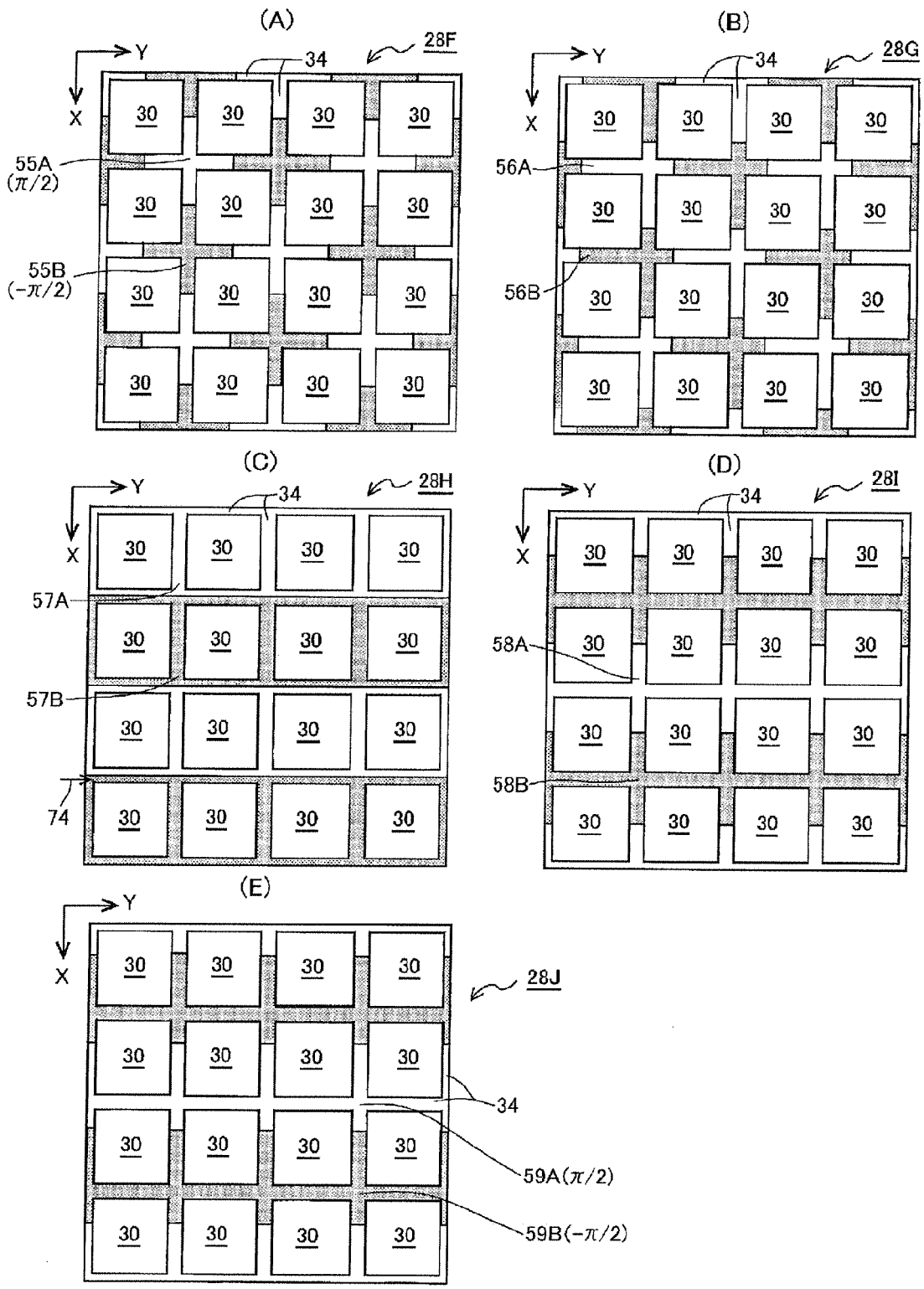
FIGS. 16(A), (B), (C), (D), and (E) are enlarged plan views each showing a part of the spatial light modulator in a first modification example, a second modification example, a third modification example, a fourth modification example, and a fifth modification example, respectively, of the second embodiment.

As shown by spatial light modulators 28H, 28I, and 28J of modification examples in FIGS. 16(C), (D), and (E), two regions 57A, 57B, 58A, 58B, and 59A, 59B the change amounts of phases of reflected beams from which are 180° different from each other may be alternately (or periodically) provided in one direction (the X-direction herein) of the boundary portions 34 between the mirror elements 30. The arrangement pitch of the regions 57A, 57B and others may be, for example, twice the arrangement pitch px of the mirror elements 30. In these cases, the boundaries between the regions 57A, 57B are located between two adjacent mirror elements 30, the boundaries between the regions 58A, 58B at the centers of the mirror elements 30, and the boundaries between the regions 59A, 59B at arbitrary positions shifted from the centers of the mirror elements 30. The illumination light impinging on the array of mirror elements 30 in the spatial light modulators 28H-28J is inclined at the incidence angle α to the Y-direction indicated by arrow 74 on average (the direction perpendicular to the array direction of regions 57A, 57B or the like). For this reason, the electric fields of the reflected beams with the phase difference of 180° from the boundary portions 34 become approximately equal, so as to enhance the reduction of light intensity due to the interference.

The same effects are also achieved with the use of the spatial light modulators 28F-28J of these modification examples as with the use of the spatial light modulator 28E in FIG. 14(A).

Figure 17:
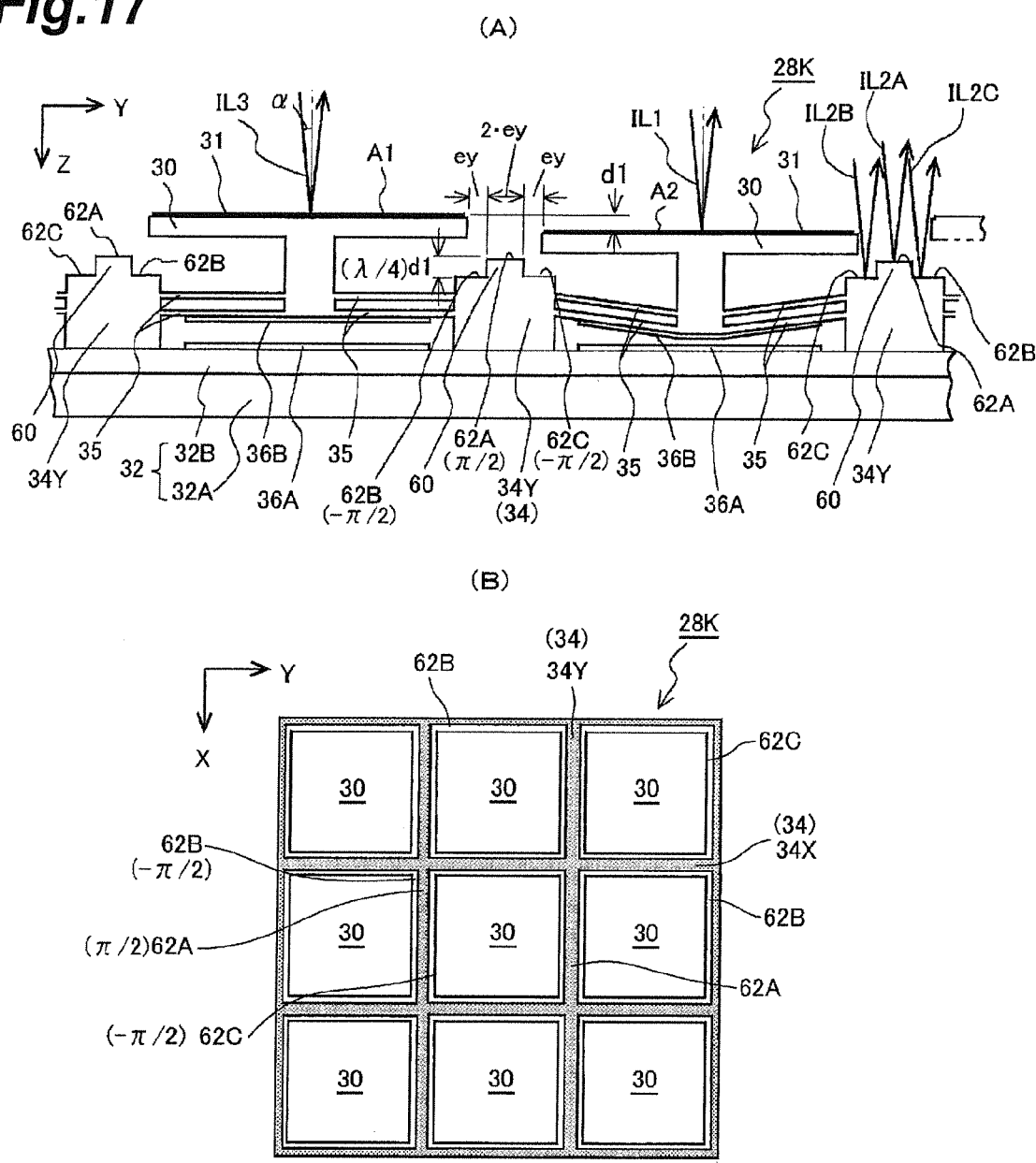
FIG. 17(A) is an enlarged sectional view showing a part of spatial light modulator 28K in a sixth modification example, and FIG. 17(B) an enlarged plan view showing a part of spatial light modulator 28K.

(2) As shown by a spatial light modulator 28K of a modification example in FIG. 17(A), a projection 60 of a rectangular sectional shape with the height of d1 (180° in terms of phase) may be provided in a central area on a surface of each Y-directional boundary portion 34Y between mirror elements 30. The projection 60 is formed integrally with the boundary portion 34 and the width of the projection 60 has an optimum value dependent on the gap between the mirror elements 30, the Z-directional thickness of the mirror elements 30, etc. to minimize the reflectance from the boundary portion 34. It is considered that when the width of the projection 60 is half of the gap between the mirror elements 30, two regions to induce 180° different change amounts of phases geometrically have the same area to minimize the reflectance from the boundary portion 34, but if the width of the boundary portion 34 is very small, there are rays traveling to below the mirror elements 30 and not reflected because of diffraction of light and there are also rays absorbed by the side walls of the mirror elements 30. For this reason, it is not always optimal to set the width of the projection 60 to half of the gap between the mirror elements 30. In FIG. 17(A), however, the width of the projection 60 is set to half of the gap between the mirror elements 30 for simplicity. Namely, when the gap (cy) between the mirror elements 30 is assumed to be 4·ey, the width of the surface of the projection 60 is 2·ey and in the surface of the boundary portion 34, the widths of two regions 62B, 62C on both sides of the projection 60 in the gap between the mirror elements 30 are ey. When the average incidence angle α of the illumination light (wavelength λ) is small, the height d1 of the projection 60 is λ/4 as an example. As shown in FIG. 17(B), the projection 60 with the height of d1 and the width of half of the mirror gap is also provided in the central region of the surface of each X-directional boundary portion 34X between the mirror elements 30. The other configuration is the same as that of the spatial light modulator 28E in FIG. 14(A).

In this spatial light modulator 28K, the change amount of the phase of illumination beam IL2A reflected by the region 62A of the surface of the projection 60 is 180° different from the change amount of the phases of illumination beams IL2B, IL2C reflected by the regions 62B, 62C on both sides of the projection 60, out of illumination beams incident onto the boundary portion 34 in the gap between the mirror elements 30, and the intensities thereof become smaller because of the interference between them on the surface of the wafer. Therefore, the same effects are also achieved as in the case using the spatial light modulator 28E.

(3) As shown by spatial light modulators 28L and 28M of modification examples in FIGS. 18(A) and (B), projections 64 and 66 with the height of d3 and d4 and the sectional shape of an isosceles triangle may be provided in the centers of the surfaces of the respective Y-directional boundary portions 34Y between the mirror elements 30. Each of the projections 64, 66 is formed integrally with the boundary portion 34 and the width of the projection 64, 66 is, for example, the same as the gap cy between the mirror elements 30. This width of projection 64, 66 also has an optimum value to minimize the reflectance from the boundary portions 34 as the width of the projection 60 in FIG. 17(A) does. As an example, the height d3 of the projection 64 is twice the gap d1 (360° in terms of phase) and, the height d4 of the projection 66 is larger than the height d3 and, for example, eight times the height d3. Therefore, when the average incidence angle α of the illumination light (wavelength λ) is small, the height d3 is λ/2 and the height d4 4λ, as an example. The same projections as the projections 64 and 66 are also provided in the centers of the surfaces of the respective X-directional boundary portions between the mirror elements 30. The other configuration is the same as that of the spatial light modulator 28E in FIG. 14(A).

In the spatial light modulator 28L in FIG. 18(A), the change amount of the phase of the illumination beam IL2A reflected at a position PA2 near the top of the surface of the projection 64 is approximately 180° different from the change amount of the phase of the illumination beam IL2B reflected at a position PB2 of a nearly middle height of the projection 64, out of illumination beams incident to the boundary portion 34Y in the gap between the mirror elements 30, and the intensities thereof become smaller because of the interference between them on the surface of the wafer. Therefore, the same effects are also achieved as in the case using the spatial light modulator 28E.

In the spatial light modulator 28M in FIG. 18(B), the top of the projection 66 is high and inclination angles of surfaces of the projection 66 are large. For this reason, most of the illumination beams IL2A, IL2B incident onto the boundary portion 34Y in the gap between the mirror elements 30 are reflected toward the bottom faces of the mirror elements 30 on the surface of the projection 66 so as not to reach the wafer. Therefore, the same effects are also achieved as in the case using the spatial light modulator 28E.

Figure 19:
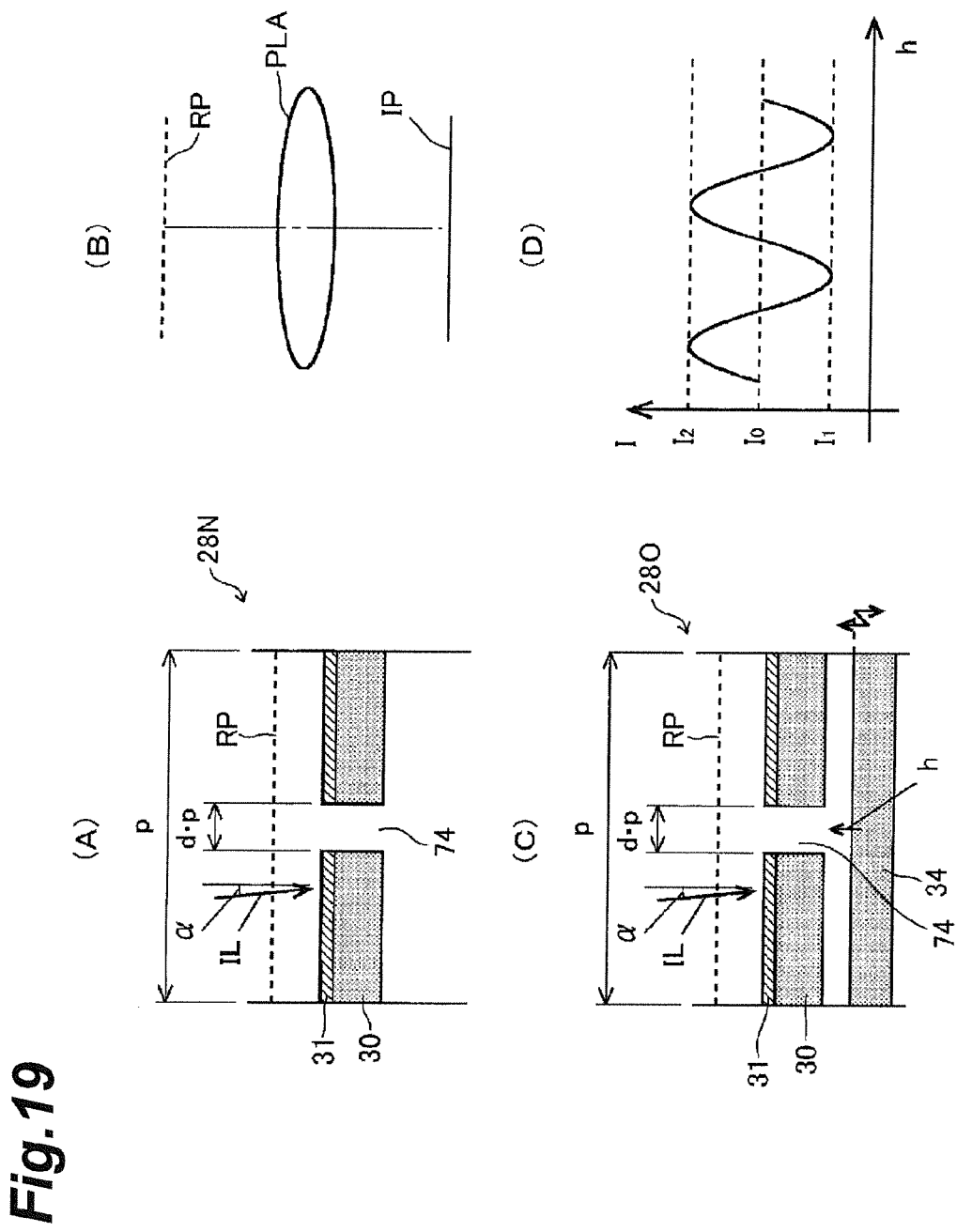
FIG. 19(A) is a drawing showing the major part of an evaluation model of spatial light modulator, FIG. 19(B) a drawing showing an optical system for evaluation, FIG. 19(C) a drawing showing the major part of an evaluation model including a boundary portion of the spatial light modulator, and FIG. 19(D) a drawing showing an example of relationship between height of a support part and light intensity of reflected light.

The influence of the reflected light from the boundary portions 34 (the substantial reflectance of the gap regions between the mirror elements 30) will be evaluated by simulation using the spatial light modulators of the above second embodiment and modification examples thereof. FIGS. 19(A) and (C) show the mirror elements 30 and boundary portion 34 in one period (assumed to be pitch p) in spatial light modulators 28N and 28O as models for evaluation. The spatial light modulator 28N is the model without the boundary portion 34 where there is only reflected light from the mirror elements 30. The spatial light modulator 28O is the model in which the height h of the boundary portion 34 is variable. When a ratio of the width of the gap region 74 between the mirror elements 30, to the pitch p is defined as d (0<d<1), the width of the gap region 74 is given by d·p. Let us assume as an example that the wavelength λ of the illumination light IL is 193 nm, the material of the mirror elements 30 and boundary portion 34 is amorphous silicon (α-Si) (the refractive index n=1.13 and the extinction coefficient k=2.1), and the material of the reflective films 31 on the surfaces of the mirror elements 30 is aluminum (the thickness=0.07 μm, the refractive index n=0.113, and the extinction coefficient k=2.2). The pitch p is 8 μm or 1 μm and the width d·p of the gap region 74 with the pitch p of 8 μm or 1 μm is 1 μm or 0.2 μm, respectively.

Furthermore, it is assumed that the illumination condition for the spatial light modulators 28N, 28O is small σ illumination with the σ value of 0.14 and the polarization condition is random illumination. An electric field (phase pattern) is formed on a receptive plane RP with the illumination light under these conditions. FIG. 19(B) shows a projection optical system PLA for evaluation which forms an image at the same magnification as the phase pattern on the receptive plane RP, on the image plane IP. It is also assumed that when the pitch p is 8 μm or 1 μm, the numerical aperture NA of the projection optical system PLA is 1.35/400 or 1.35/50, respectively. Namely, the resolving power of the projection optical system PLA is low, and thus the image of the mirror elements 30 and gap region 74 in one period in the spatial light modulators 28N, 28O by the projection optical system PLA comes to have a uniform intensity distribution, in which the gap structure does not appear in the spatial image.

In this case, let $I_0$ be the intensity of the spatial image of the mirror elements 30 in the spatial light modulator 28N by the projection optical system PLA. Since with variation in the height h of the boundary portion 34 in the spatial light modulator 28O the intensity I of the spatial image of the mirror elements 30 and boundary portion 34 by the projection optical system PLA periodically varies against the height h as shown in FIG. 19(D), maxima and minima of the intensity I are defined as $I_2$ and $I_1$. At this time, the reflectance of the boundary portion 34 in the gap region 74 (which will be referred to hereinafter as gap reflectance) is expressed by the formula below. The function max(a, b) indicates the larger of values a and b.

$$\text{Gap reflectance} = \max\left\{\left(\frac{\sqrt{I_1} - \sqrt{I_0}}{d}\right)^2, \left(\frac{\sqrt{I_2} - \sqrt{I_0}}{d}\right)^2\right\} \quad (11)$$

Figure 20:
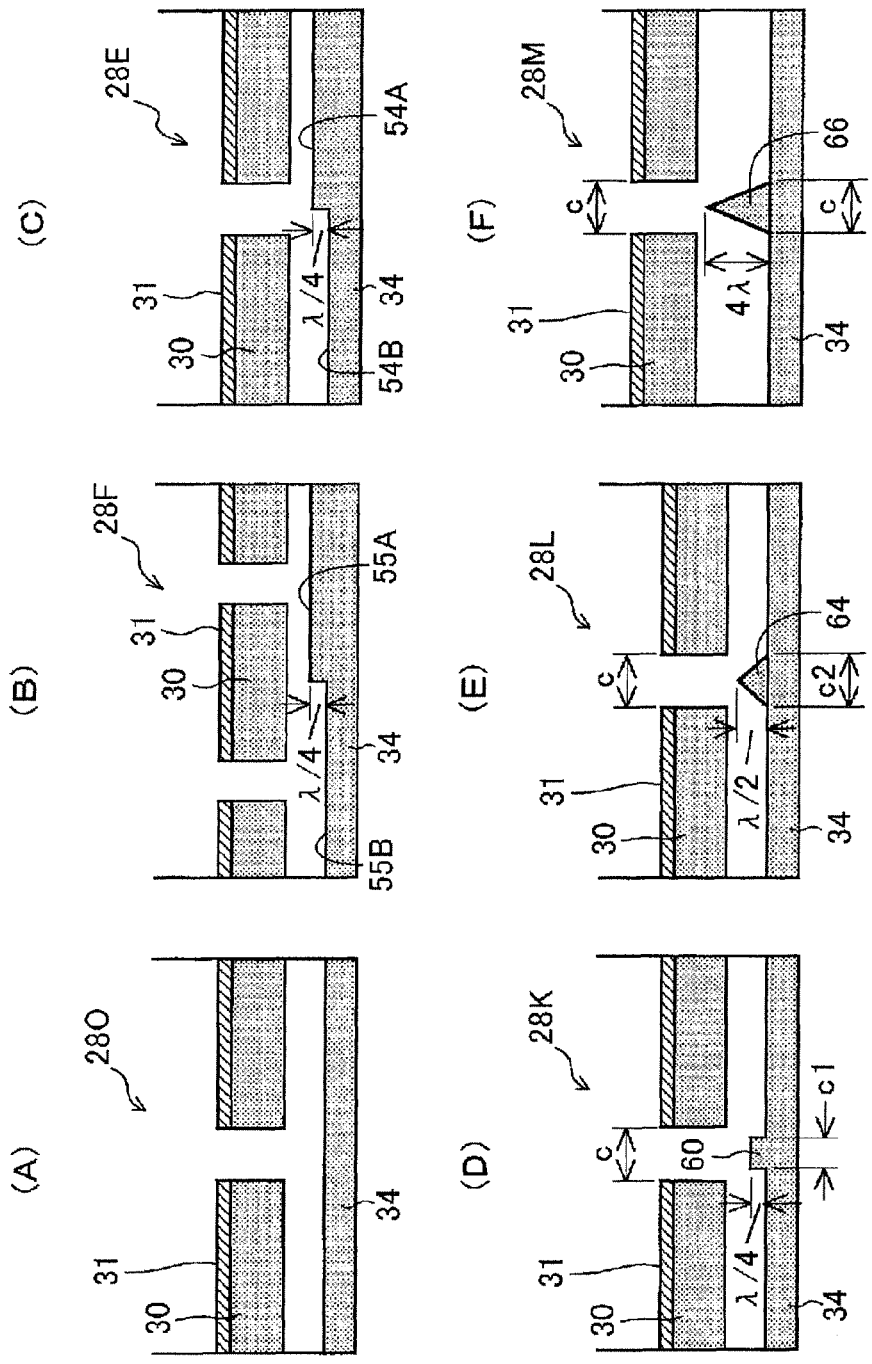
FIGS. 20(A), (B), (C), (D), (E), and (F) are enlarged sectional views showing simplified structures of one period in the spatial light modulators of the evaluation model, the first modification example, the second embodiment, the sixth modification example, the seventh modification example, and the eighth modification example, respectively.

Models to evaluate the gap reflectance are assumed to be the spatial light modulator 28O shown in FIG. 20(A) (the model without any step or projection which is the same as that in FIG. 19(C)), a spatial light modulator 28F with regions 55A, 55B of different heights by λ/4 (180° in terms of the change amount of the phase of reflected light) in each period as shown in FIG. 20(B), and a spatial light modulator 28E in which a boundary between regions 54A, 54B with different heights by λ/4 is located in the gap region between the mirror elements 30, as shown in FIG. 20(C). Further models assumed herein include spatial light modulators 28K, 28L, and 28M with a projection 60 of a height of λ/4 in a width c1 (the width of the gap region is assumed to be c), with a projection 64 of a height of λ/2 in a width of c2, and with a projection 66 of a height of 4λ in a width c, respectively, in one period as shown in FIGS. 20(D), (E), and (F).

Figure 21:
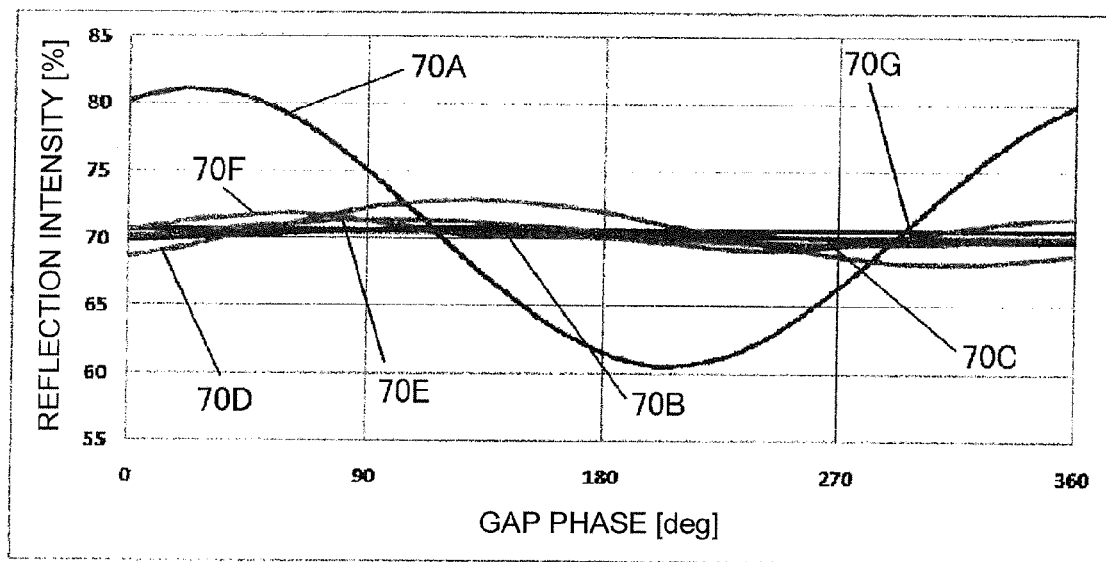
FIG. 21 is a drawing showing an example of relationship between phase of reflected light and intensity of reflected light in the gap regions in the spatial light modulators.

FIG. 21 shows the result of calculation of the intensity I on the image plane IP in FIG. 19(B) with variation in the height h of the boundary portion 34 about the spatial light modulators 28O to 28M in FIGS. 20(A) to (F), where the pitch p of the mirror elements 30 is set at 8 μm (c=1 μm). In FIG. 21, the horizontal axis represents the height h of the boundary portion 34 in terms of phase (provided that 2π is assumed to be 360°), and the vertical axis represents the intensity I (reflection intensity) with respect to the intensity in the case where the reflectance is 100% over the entire surface. In FIG. 21, a straight line 70G at the reflection intensity of about 70% indicates the intensity obtained by calculation with a model obtained by removing the boundary portion 34 from the spatial light modulator in FIG. 20(A) and this curve shows the constant value independent of the height h because of the absence of the boundary portion 34. In FIG. 21, a curve 70A of a sinusoidal shape indicates the intensity obtained by the spatial light modulator 28O in FIG. 20(A), curves 70B and 70C of nearly straight lines the intensities obtained by the spatial light modulators 28F, 28E in FIGS. 20(B) and (C), curves 70D and 70E of sinusoidal shapes with small amplitude the intensities obtained by optimizing the widths c1 and c2 of the projections 60 and 64 to 300 nm and 500 nm, respectively, in the spatial light modulators 28K and 28L in FIGS. 20(D) and (E), and a curve 70F the intensity obtained by the spatial light modulator 28M in FIG. 20(F).

The gap reflectances obtained by substituting the maxima and minima of the curves 70A-70F in FIG. 21 into formula (11) are 24.2%, 0.02%, 0.09%, 1.8%, 0.3%, and 0.9%, respectively. It is found by this result that the spatial light modulator 28F in FIG. 20(B) demonstrates the smallest gap reflectance so that it can minimize the influence of the reflected light from the boundary portion 34.

Figure 22:
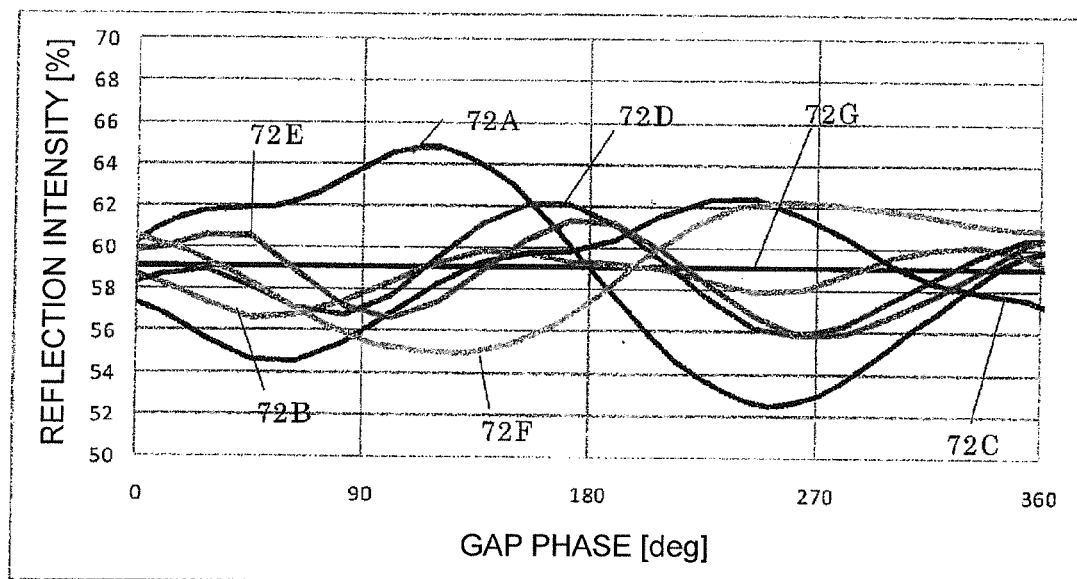
FIG. 22 is a drawing showing another example of relationship between phase of reflected light and intensity of reflected light in the gap regions in the spatial light modulators.

Next, FIG. 22 shows the result of calculation of the intensity I on the image plane IP in FIG. 19(B) with variation in the height h of the boundary portion 34, where the pitch p of the mirror elements 30 is set at 1 μm (c=0.2 μm). The vertical axis and horizontal axis in FIG. 22 are the same as in FIG. 21. In FIG. 22, a straight line 72G at the reflection intensity of about 59% indicates the intensity in the case of aluminum mirrors over the entire surface in one period, a curve 72A of a sinusoidal shape the intensity obtained by the spatial light modulator 28O in FIG. 20(A), curves 72B and 72C the intensities obtained by the spatial light modulators 28F, 28E in FIGS. 20(B) and (C), curves 72D and 72E the intensities obtained by optimizing the widths c1 and c2 of the projections 60 and 64 to c/10 and c/5, respectively, in the spatial light modulators 28K and 28L in FIGS. 20(D) and (E), and a curve 72F the intensity obtained by the spatial light modulator 28M in FIG. 20(F).

The gap reflectances obtained by substituting the maxima and minima of the curves 72A to 72F in FIG. 22 into formula (11) are 5.2%, 0.5%, 2.2%, 1.6%, 1.0%, and 1.8%, respectively. It is found by this result that, in the case of the pitch p being 1 µm, the spatial light modulator 28F in FIG. 20(B) also demonstrates the smallest gap reflectance so that it can minimize the influence of the reflected light from the boundary portion 34.

Figure 23:
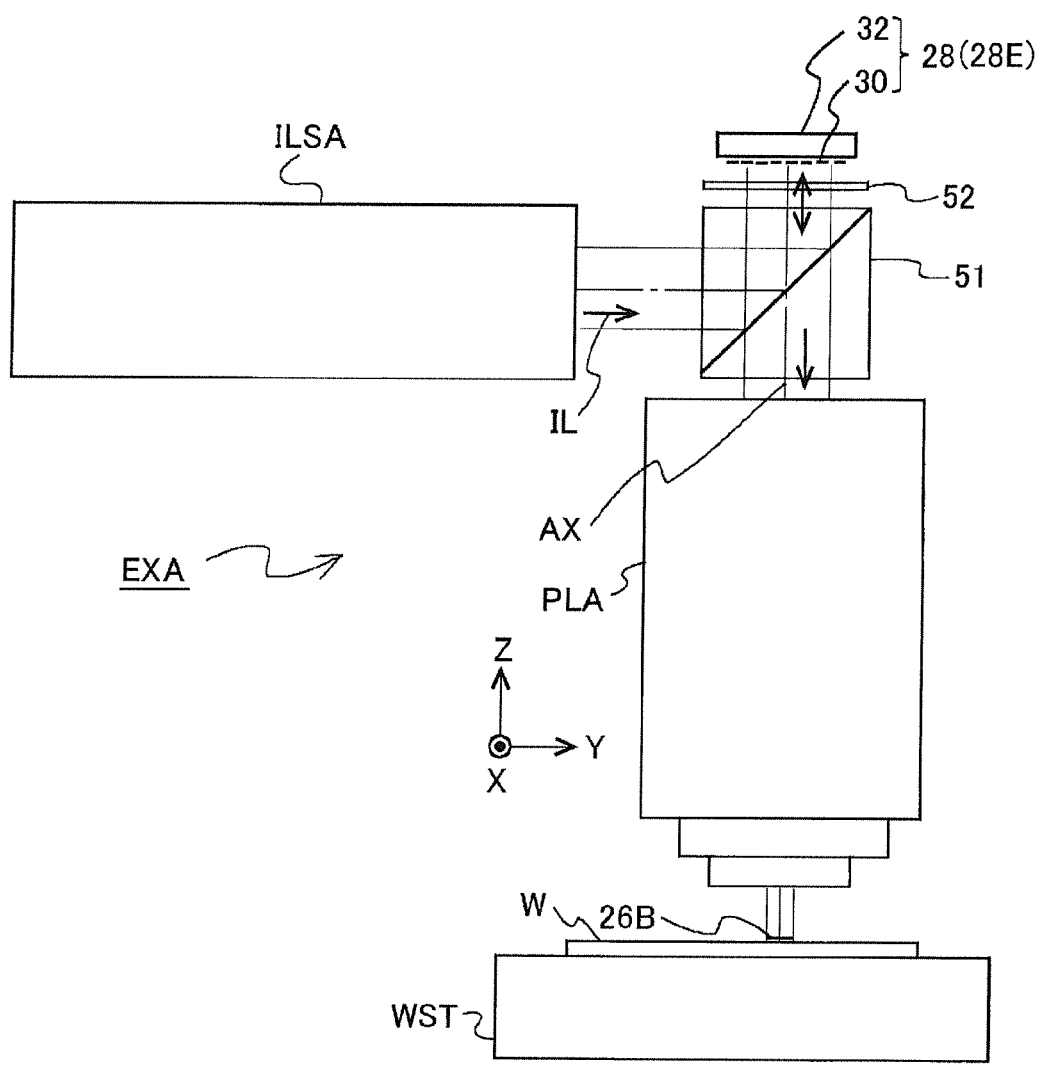
FIG. 23 is a drawing showing a schematic configuration of an exposure apparatus according to another embodiment.

(4) The foregoing first and second embodiments employ the projection optical system PL non-telecentric on the object side. Besides it, it is also possible to use the projection optical system PLA bitelecentric on the object side and on the image side, as shown by an exposure apparatus EXA of a modification example in FIG. 23. In FIG. 23, the exposure apparatus EXA has an illumination optical system ILSA which generates S-polarized illumination light IL approximately in the +Y-direction, a polarization beam splitter 51 which reflects the illumination light IL into the +Z-direction, a quarter wave plate 52 which converts the illumination light IL from the polarization beam splitter 51 into circularly polarized light, the spatial light modulator 28 with the two-dimensional array of the large number of mirror elements 30 which reflects the circularly polarized illumination light IL into the −Z-direction, and a projection optical system PLA which receives the illumination light IL having traveled through the quarter wave plate 52 and the polarization beam splitter 51 after having been reflected by the mirror elements 30 and which projects a spatial image (pattern) onto the exposure area 26B on the surface of the wafer W. The illumination optical system ILSA is an optical system obtained by excluding the mirrors 8B, 8C from the illumination optical system ILS in FIG. 1. The configuration and action of the spatial light modulator 28 are the same as in the embodiment shown in FIG. 1. The illumination light IL with small σ value reflected by the spatial light modulator 28 is incident into the projection optical system PL approximately in parallel with the optical axis AX of the projection optical system PL.

In this modification example, however, the illumination light IL is incident at the incidence angle of approximately 0 to the mirror elements 30 in the spatial light modulator 28. For this reason, the following formulas with the incidence angle α of 0 are applied instead of the formulas (8C) and (9C) to express the distance d1 of the reflective surfaces of the mirror elements 30 and the distance d2 of the boundary portions 34 in FIG. 2(B).

$$d1 = \lambda/4 \quad (12A),$$

$$d2 = \lambda/8 + k \cdot \lambda/4 \quad (12B)$$

Since the exposure apparatus EXA of this modification example allows the use of the bitelecentric projection optical system PLA, the configuration of the exposure apparatus can be simplified.

In the exposure apparatus EXA of this modification example, for example, the spatial light modulator 28E in FIG. 14(A) or the like in the second embodiment may be used instead of the spatial light modulator 28.

When the utilization efficiency of illumination light IL is allowed to reduce to half, an ordinary beam splitter may be used instead of the polarization beam splitter 51, without use of the quarter wave plate 52. In this case, polarized illumination is available.

(5) A rod type integrator can also be used as an internal reflection type optical integrator, instead of the microlens array 16 being the wavefront division type integrator in FIG. 1. In this case, in FIG. 1, a condensing optical system is added on the diffractive optical element 10A side with respect to the relay optical system 14 to form a conjugate plane with the reflective surface of the diffractive optical element 10A, and the rod type integrator is arranged so that an entrance end thereof is positioned near this conjugate plane.

There is a relay optical system arranged for forming an image of an illumination field stop located on or near an exit end face of the rod type integrator, on the reflective surface of the spatial light modulator 28. In the case of this configuration, the secondary light source is formed on the pupil plane of the relay optical system 14 and condensing optical system (a virtual image of the secondary light source is formed near the entrance end of the rod type integrator).

(6) The foregoing first and second embodiments and modification examples use the spatial light modulator 28 (28A-28E and others) with the large number of mirror elements 30 of microscopic mirrors arranged in the two-dimensional array pattern on or near the illumination target surface and each having the variable height. Besides it, as shown by an exposure apparatus EXB of a modification example in FIG. 24, it is also possible to adopt a configuration wherein a spatial light modulator 10C having the same configuration as the spatial light modulator 28 (or 28A-28E or the like) with the large number of mirror elements 30 of microscopic mirrors arranged in the two-dimensional array pattern and each having the variable height, may be arranged at the position where the diffractive optical element 10A in FIG. 1 or the like is located, in order to form the secondary light source with a desired light intensity distribution on the pupil plane of the illumination optical system ILSB (illumination pupil plane IPP).

Figure 24:
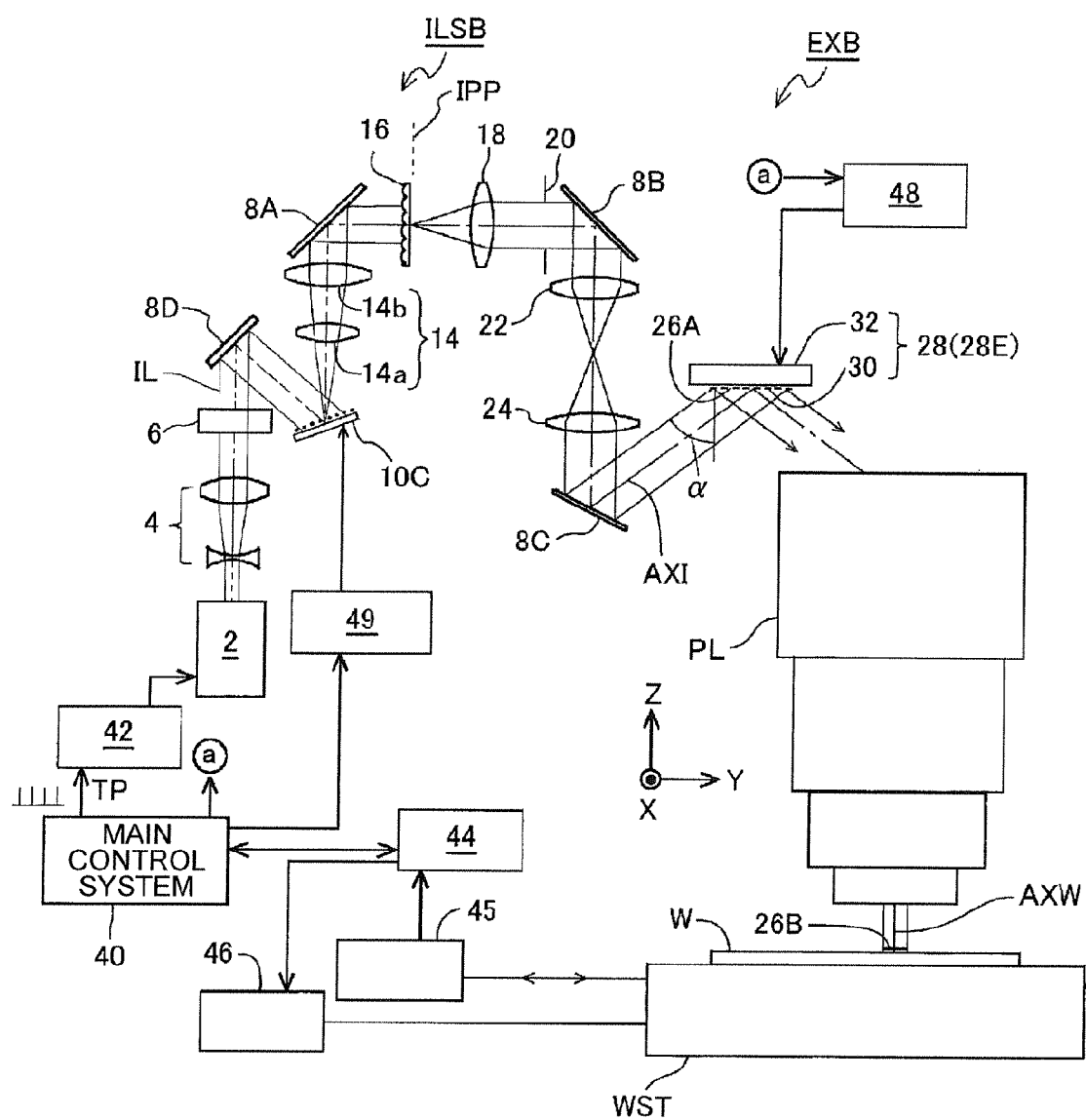
FIG. 24 is a drawing showing a schematic configuration of an exposure apparatus in a modification example.

In FIG. 24, the members having the same functions as in the embodiment shown in FIG. 1 and others are denoted by the same reference signs for simplicity of description. In FIG. 24, the exposure apparatus EXB has the illumination optical system ILSB different in the optical path from the polarization control optical system 6 to the microlens array 16 from that in the embodiment shown in FIG. 1 and others.

In FIG. 24, the illumination light IL having passed through the polarization control optical system 6 illuminates the reflective surfaces of the large number of mirror elements each having the variable height in the spatial light modulator 10C via the mirror 8D for folding of optical path. The illumination light IL reflected by the spatial light modulator 10C then travels via the relay optical system 14 and the mirror 8A to enter the microlens array 16. The spatial light modulator 10C has the same configuration as the spatial light modulator 28, 28A-28E, or the like, and the respective heights of the large number of mirror elements as the micromirrors arranged in the two-dimensional array pattern are set in a predetermined height distribution to form a predetermined reflection diffraction pattern, thereby to reflect the incident illumination light IL into a plurality of arbitrary directions, whereby a desired pupil luminance distribution is formed in the far field of the spatial light modulator 10C and on the illumination pupil plane IPP eventually. The modulation control unit 49 controls the height distribution of the reflective surfaces in the spatial light modulator 10C corresponding to the light intensity distribution of the secondary light source formed on the illumination pupil plane IPP.

(7) In the foregoing first and second embodiments and modification examples, the spatial light modulator has the microscopic mirrors each having the variable height and arranged in the two-dimensional array pattern. Besides it, as shown in FIG. 25, it is also possible to use a spatial light modulator 28P in which micromirrors are arranged in a two-dimensional array pattern and in which an inclination direction and an inclination angle of a reflective surface of each mirror are individually variable, in order to form the desired pupil luminance distribution on the illumination pupil plane IPP.

Furthermore, the spatial light modulator 28P may also be used as the spatial light modulator 10C in FIG. 24. In this case, the respective inclination angles of the large number of mirror elements are set in a predetermined inclination angle distribution to form a predetermined reflection diffraction pattern, thereby to reflect the incident illumination light IL into a plurality of arbitrary directions, whereby the desired pupil luminance distribution is formed in the far field of the spatial light modulator 10C and on the illumination pupil plane IPP eventually.

Figure 25:
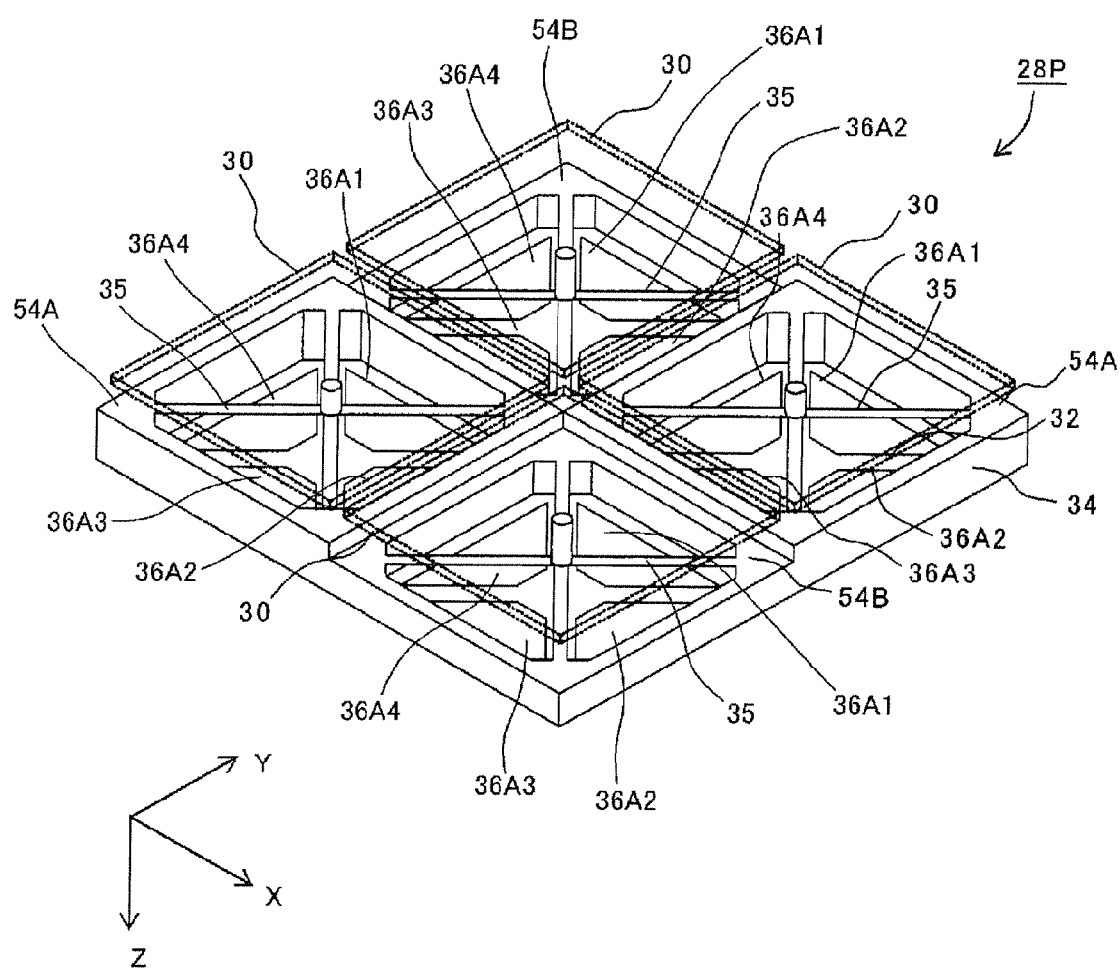
FIG. 25 is an enlarged perspective view showing a spatial light modulator in a modification example.

In FIG. 25 the members having the same functions as in the foregoing embodiments and modification examples are denoted by the same reference signs for simplicity of description. In FIG. 25, the spatial light modulator 28P has the large number of mirror elements 30 arranged in a two-dimensional array pattern, the base member 32 for supporting each mirror element 30 through hinge members 35 with flexibility (elasticity), the large number of boundary portions 34 arranged in gap regions between adjacent mirror elements 30 and fixed to the base member 32, and electrodes 36A1-36A4 formed on the surface of the base member 32 on the bottom side of the mirror elements 30. In the example of FIG. 25, electrostatic forces acting between the electrodes are controlled by making use of potential differences between the back surface of each mirror element 30 and the electrodes 36A1-36A4, whereby the mirror element 30 flexibly supported through the hinge members 35 can be swung and tilted, for example, around the θy axis and around the θx axis.

In the example of FIG. 25, as in the case of the spatial light modulator 28E shown in FIG. 14, the height of the first region 54A of the boundary portion 34 surrounding a certain mirror element 30 is set higher by the distance d1 (approximately 180° in terms of the phase difference of reflected light) than the height of the second region 54B of the boundary portion 34 surrounding another mirror element 30 adjacent in the X-direction or in the Y-direction to the mirror element 30, so as to reduce the influence of light from the gap region between the mirror elements 30.

When this spatial light modulator 28P shown in FIG. 25 is applied to the exposure apparatus EXB in FIG. 24, the respective inclination angles of the large number of mirror elements in the spatial light modulator 28P are set in a predetermined inclination angle distribution to reflect the incident illumination light IL into a plurality of arbitrary directions, whereby a predetermined reflection diffraction pattern is formed in the far field (far field region) of the spatial light modulator 10C. Then the relay optical system 14 arranged on the exit side of the spatial light modulator 10C forms the reflection diffraction pattern formed in the far field of the spatial light modulator 10C, as a pupil luminance distribution on the illumination pupil plane IPP. In this case, diffraction interference fringes caused by the spatial light modulator 28P can be reduced on the illumination pupil plane. The spatial light modulator 28P with the elements arranged in the two-dimensional array pattern and with the inclination directions and inclination angles of the reflective surfaces thereof being individually variable may be provided instead of the spatial light modulator 28E for forming the mask pattern with the variable phase distribution (variable uneven pattern).

Figure 26:
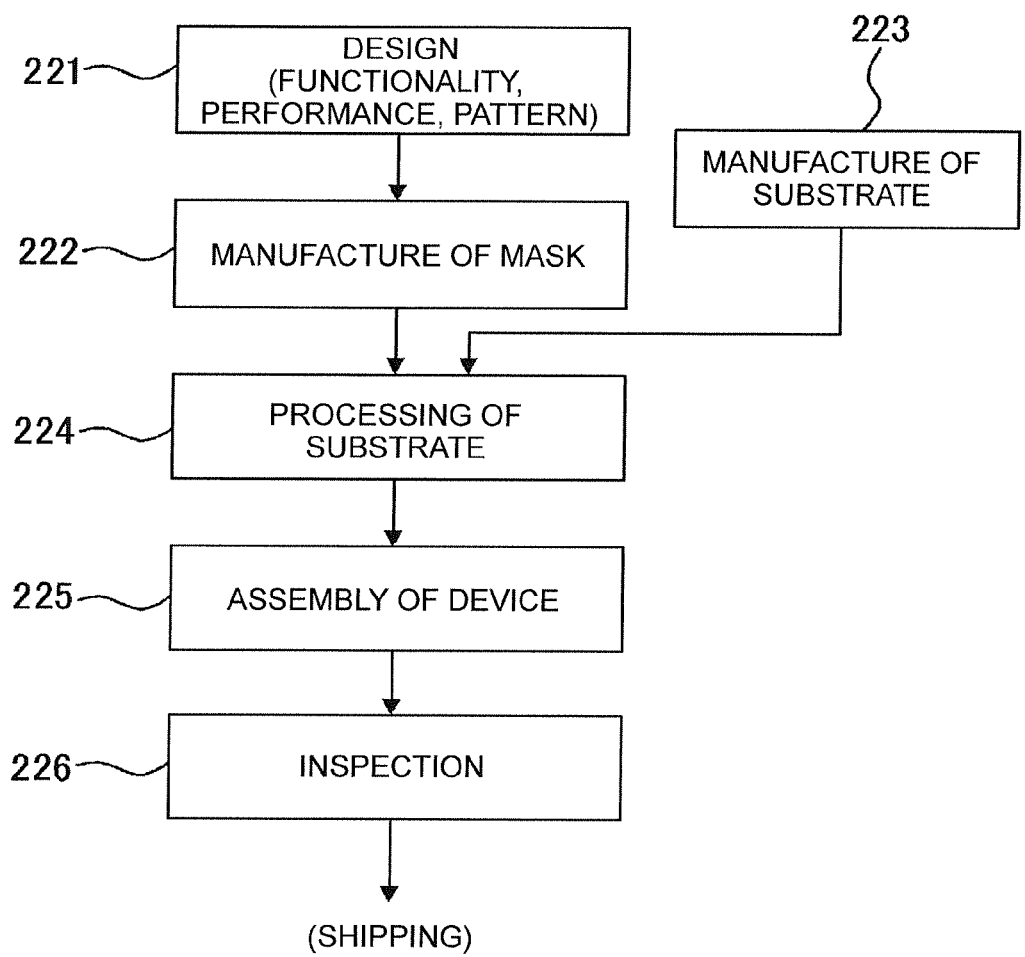
FIG. 26 is a flowchart showing an example of steps for manufacturing electronic devices.

In manufacture of electronic devices (or microdevices), the electronic devices are manufactured, as shown in FIG. 26, through a step 221 to perform design of functionality and performance of the electronic devices, a step 222 to store pattern data of a mask based on this design step, into the main control system of the exposure apparatus EX, EXA in the embodiment, a step 223 to produce a substrate (wafer) as a base material of the devices and coat the substrate with a resist, a substrate processing step 224 including a step of exposing the substrate (photosensitive substrate) with the spatial image of the phase distribution generated in the spatial light modulator 28, 28A by the aforementioned exposure apparatus EX, EXA (or the exposure method), a step of developing the exposed substrate, and heating (curing) and etching steps of the developed substrate, a device assembly step (including processing steps such as a dicing step, a bonding step, a packaging step, and so on) 225, an inspection step 226, and so on.

This device manufacturing method includes the step of exposing the wafer W with the use of the exposure apparatus of the above embodiment, and the step of processing the exposed wafer W (step 224). Therefore, the electronic devices can be manufactured with high accuracy.

The present invention is not limited to the application to semiconductor device manufacturing processes, but the present invention is also widely applicable, for example, to manufacturing processes of liquid crystal display devices, plasma displays, and so on and to manufacturing processes of various devices (electronic devices) such as imaging devices (CMOS type, CCD, etc.), micromachines, MEMS (Microelectromechanical Systems), thin film magnetic heads, and DNA chips.

The present invention is not limited to the above embodiments, but can be realized in various configurations within the scope not departing from the spirit and scope of the present invention. The disclosures in the foregoing Publications, International Publications, U.S. Patents, or U.S. Pat. Published Applications cited in the present specification are incorporated as part of the description of the present specification. The entire disclosure contents in Japanese Patent Application No. 2010-212850 filed on Sep. 22, 2010 and U.S. Pat. Application No. 61/489,470 filed on May 24, 2011 including the specification, the scope of claims, the drawings, and the abstract are incorporated herein by reference in their entirety.

REFERENCE SINGS LIST

EX, EXA, EXB exposure apparatus; ILS, ILSA, ILSB illumination optical system; PL, PLA projection optical system; W wafer; 28, 28A-28M spatial light modulator; 28P spatial light modulator; 30 mirror element; 32 base member; 34, 34X, 34Y boundary portion; 35 hinge portion; 38 boundary portion; 48 modulation control unit.

The invention claimed is:

1. A spatial light modulator that modulates incident light and emits the modulated light, the spatial light modulator comprising:
 a plurality of reflective elements that have reflective surfaces situated to reflect the incident light, each reflective surface being able to change at least one of position and inclination;
 a first portion situated to reflect light incident to a gap between the reflective surfaces of adjacent reflective elements, and
 a second portion that reflects light incident to the gap, wherein the first portion and the second portion are situated at the gap between the adjacent reflective elements so that a predetermined phase difference is set between light reflected by the first portion and the second portion.

2. The spatial light modulator according to claim 1, wherein the phase difference between the light reflected by the first portion and the light reflected by the second portion.

3. The spatial light modulator according to claim 1, wherein the first and second portions are provided in a portion that continuously changes the phase of the light incident to the gap.

4. The spatial light modulator according to claim 1, wherein the plurality of reflective elements are controllable in a plurality of states, the plurality of states including a first state in which the reflective element allows the incident light thereto to pass without any change in the phase thereof or with a first phase change, and a second state in which the reflective element allows the incident light thereto to pass with a second phase change that differs from the first phase change by 180°.

5. The spatial light modulator according to claim 4, wherein the reflective surfaces of the plurality of reflective elements are parallel to each other, and
   wherein, where $\alpha$ represents an average incidence angle of the incident light to the plurality of reflective elements and $\lambda$ a wavelength of the incident light,
   a difference between a height in the first state and a height in the second state of the reflective surfaces of the optical plurality of reflective elements is $(1/\cos \alpha)\lambda/4$, and
   a difference between a height of the first portion and a height of the second portion is substantially $(1/\cos \alpha)(\lambda/4)$.

6. The spatial light modulator according to claim 5, further comprising a base part that is connected through a movable part to each of the optical reflective surfaces and to which the first and second portions are fixed.

7. The spatial light modulator according to claim 5, wherein at least one of the first portion and the second portion is connected to at least one reflective element of the reflective elements.

8. The spatial light modulator according to claim 1, wherein the reflective elements are tiltable with respect to an arrangement surface where the reflective surfaces are arranged.

9. The spatial light modulator according to claim 1, wherein the reflective elements are a two-dimensional array.

10. An exposure apparatus for exposing a substrate with exposure light, comprising:
    the spatial light modulator as defined in claim 1;
    an illumination optical system for illuminating the array of reflective elements in the spatial light modulator with the exposure light;
    a projection optical system for guiding light from the reflective elements onto the substrate to project a pattern onto the substrate; and
    a control device for controlling the reflective surfaces of the reflective elements in the spatial light modulator individually into any one of a plurality of states, to control the pattern to be exposed on the substrate.

11. The exposure apparatus according to claim 10, wherein the control device controls each of the reflective elements into the first state or into the second state.

12. An exposure apparatus for exposing a substrate with exposure light, comprising:
    an illumination optical system comprising the spatial light modulator as defined in claim 1, for illuminating an illumination target surface with a predetermined pattern arranged thereon, with the exposure light;
    a projection optical system for guiding light from the illumination target surface onto the substrate to project the pattern onto the substrate; and
    a control device for controlling the reflective surfaces of the reflective elements in the spatial light modulator individually into any one of a plurality of states, to control the exposure light to illuminate the illumination target surface.

13. The exposure apparatus according to claim 12, wherein the spatial light modulator is arranged on the illumination target surface, and
    wherein the control device controls the reflective surfaces of the reflective elements in the different spatial light modulator individually into any one of a plurality of states, to control the pattern to be exposed on the substrate.

14. A spatial light modulator having an array of optical elements to be illuminated with light,
    wherein each of the optical elements is controllable into a plurality of states including a first state and a second state,
    wherein a phase of light emitted from the optical elements in the second state is different by 180° from a phase of light emitted from the optical elements in the first state,
    wherein the spatial light modulator comprises at least one boundary portion arranged between the optical elements,
    wherein a phase of light emitted from the boundary portion is different substantially by $(90°+k\cdot 180°)$ (where k is an integer) from the phase of the light from the optical elements in the first state.

15. The spatial light modulator according to claim 14, wherein the optical elements are reflective elements each of which reflects the incident light and reflective surfaces of which are parallel to each other, and
    wherein, where $\alpha$ represents an average incidence angle of the incident light to the optical elements and $\lambda$ a wavelength of the light,
    a difference between a height in the first state and a height in the second state of the reflective surfaces of the optical elements is $(1/\cos \alpha)\lambda/4$, and
    a difference between a height in the first state of the reflective surfaces of the optical elements and a height of a reflective surface of the boundary portion is substantially $(1/\cos \alpha)(\lambda/8+k\cdot\lambda/4)$.

16. The spatial light modulator according to claim 14, wherein the boundary portion includes first and second boundary portions arranged adjacent to each other between the optical elements, and
    wherein a change amount of the phase of the light incident to the first boundary portion is substantially 180° different from a change amount of the phase of the light incident to the second boundary portion.

17. The spatial light modulator according to any one of claim 14, comprising a base part that is connected through a movable part to each of the optical elements and to which the boundary portion is fixed.

18. The spatial light modulator according to claim 14, wherein the boundary portion is connected to at least one optical element out of the optical elements.

19. The spatial light modulator according to claim 14, wherein the optical elements are brought each into the first state in a power-off condition.

20. The spatial light modulator according to claim 14, wherein the optical elements are a two-dimensional array.

21. The spatial light modulator according to claim 14, wherein the optical elements are a one-dimensional array.

22. An exposure apparatus for exposing a substrate with exposure light, comprising:
   the spatial light modulator as defined in claim 14;
   an illumination optical system for illuminating the array of optical elements in the spatial light modulator with the exposure light;
   a projection optical system for guiding light from the optical elements onto the substrate to project a pattern onto the substrate; and
   a control device for controlling the optical elements in the spatial light modulator individually into any one of the plurality of states, to control the pattern to be exposed on the substrate.

23. The exposure apparatus according to claim 22, wherein the control device controls each of the optical elements into the first state or into the second state.

24. The exposure apparatus according to claim 22, wherein the optical elements are reflective elements, and
   wherein the exposure light from the illumination optical system is obliquely incident to the reflective elements, and wherein reflected light from the reflective elements is incident to the projection optical system so as to intersect with the optical axis of the projection optical system.

25. The exposure apparatus according to claim 22, comprising a beam splitter arranged between the spatial light modulator and the projection optical system,
   wherein the exposure light from the illumination optical system travels via the beam splitter, the spatial light modulator, and the beam splitter to enter the projection optical system.

26. The exposure apparatus according to claim 22, wherein the array of optical elements are provided in a rectangular region a longitudinal direction of which is a first direction,
   the exposure apparatus comprising a substrate stage for moving the substrate in a scanning direction corresponding to a second direction perpendicular to the first direction on an image plane of the projection optical system,
   wherein the control device moves the pattern formed by the optical elements, in the second direction in accordance with movement of the substrate by the substrate stage.

27. A device manufacturing method comprising:
   forming a pattern of a photosensitive layer on the substrate, using the exposure apparatus as defined in claim 10; and
   processing the substrate with the pattern formed thereon.

28. A device manufacturing method comprising:
   forming a pattern of a photosensitive layer on the substrate, using the exposure apparatus as defined in claim 12; and
   processing the substrate with the pattern formed thereon.

29. A device manufacturing method comprising:
   forming a pattern of a photosensitive layer on the substrate, using the exposure apparatus as defined in claim 22; and
   processing the substrate with the pattern formed thereon.

30. An exposure apparatus for exposing a substrate with exposure light, comprising:
   an illumination optical system comprising the spatial light modulator as defined in claim 10, for illuminating an illumination target surface with a predetermined pattern arranged thereon, with the exposure light;
   a projection optical system for guiding light from the illumination target surface onto the substrate to project the pattern onto the substrate; and
   a control device for controlling the optical elements in the spatial light modulator individually into any one of the plurality of states, to control the exposure light to illuminate the illumination target surface.

31. The exposure apparatus according to claim 30, further comprising a different spatial light modulator that is arranged on the illumination target surface, the different spatial light modulator having an array of optical elements to be illuminated with light,
   wherein the optical elements are controllable into a plurality of states including a first state and a second state different from the first state,
   wherein a boundary portion between the optical elements is provided with a first position and a second position where change amounts of phase of incident light are different from each other, and
   wherein the control device controls the optical elements in the different spatial light modulator individually into any one of the plurality of states, to control the pattern to be exposed on the substrate.

32. A device manufacturing method comprising:
   forming a pattern of a photosensitive layer on the substrate, using the exposure apparatus as defined in claim 30; and
   processing the substrate with the pattern formed thereon.

33. The spatial light modulator according to claim 1, wherein the reflective surfaces of the plurality of reflective elements are arranged on a predetermined plane and are movable in a normal direction to the plane.

34. The spatial light modulator according to claim 1, wherein the first and second portions are provided at different positions in a traveling direction of the light incident to the gap.

* * * * *